(12) United States Patent
Takagiwa

(10) Patent No.: US 8,437,197 B2
(45) Date of Patent: May 7, 2013

(54) NONVOLATILE SEMICONDUCTOR MEMORY AND METHOD OF OPERATING THE SAME

(75) Inventor: Teruo Takagiwa, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 145 days.

(21) Appl. No.: 13/051,388

(22) Filed: Mar. 18, 2011

(65) Prior Publication Data

US 2011/0235431 A1    Sep. 29, 2011

(30) Foreign Application Priority Data

Mar. 24, 2010  (JP) ................................. 2010-068433

(51) Int. Cl.
*G11C 11/34* (2006.01)
(52) U.S. Cl.
USPC ............. 365/185.22; 365/185.03; 365/185.02
(58) Field of Classification Search ............. 365/185.22, 365/185.03, 185.02
See application file for complete search history.

(56) References Cited

U.S. PATENT DOCUMENTS

| | | | |
|---|---|---|---|
| 6,907,497 B2* | 6/2005 | Hosono et al. ................ | 711/103 |
| 7,369,433 B2* | 5/2008 | Toda ........................ | 365/185.03 |
| 7,492,641 B2* | 2/2009 | Hosono et al. ............ | 365/185.22 |
| 7,545,693 B2* | 6/2009 | Toda ............................ | 365/205 |
| 7,573,744 B2* | 8/2009 | Edahiro et al. ........... | 365/185.17 |
| 8,004,889 B2* | 8/2011 | Shibata .................... | 365/185.03 |
| 8,081,512 B2* | 12/2011 | Ueno et al. ............... | 365/185.11 |

FOREIGN PATENT DOCUMENTS

| | | |
|---|---|---|
| JP | 11-232886 | 8/1999 |
| JP | 2005-353242 | 12/2005 |
| JP | 2006-277786 | 10/2006 |
| JP | 2007-500411 | 1/2007 |
| JP | 2007-66386 | 3/2007 |
| JP | 2008-4178 | 1/2008 |
| JP | 2009-134849 | 6/2009 |

OTHER PUBLICATIONS

Japanese Office Action issued Jul. 24, 2012, in Japan Patent Application No. 2010-068433 (with English translation).

\* cited by examiner

*Primary Examiner* — Viet Q Nguyen
(74) *Attorney, Agent, or Firm* — Oblon, Spivak, McClelland, Maier & Neustadt, L.L.P.

(57) ABSTRACT

According to one embodiment, a nonvolatile semiconductor memory includes memory cells arranged in a memory cell array in the form of a matrix, the memory cell storing data having two or more levels associated with two or more threshold levels, respectively, a buffer circuit including latch circuits and sense amplifier circuits, each latch circuit and each sense amplifier being associated with each column in the memory cell array, and a control circuit configured to control operations of the memory cells and the buffer circuit, the control circuit executing data writing with respect to the memory cells and first verification using judgment information indicative of a result of the data writing in a write sequence with respect to data from the outside. The judgment information is assigned to two or more threshold levels, which are not adjacent to each other, in common.

1 Claim, 9 Drawing Sheets

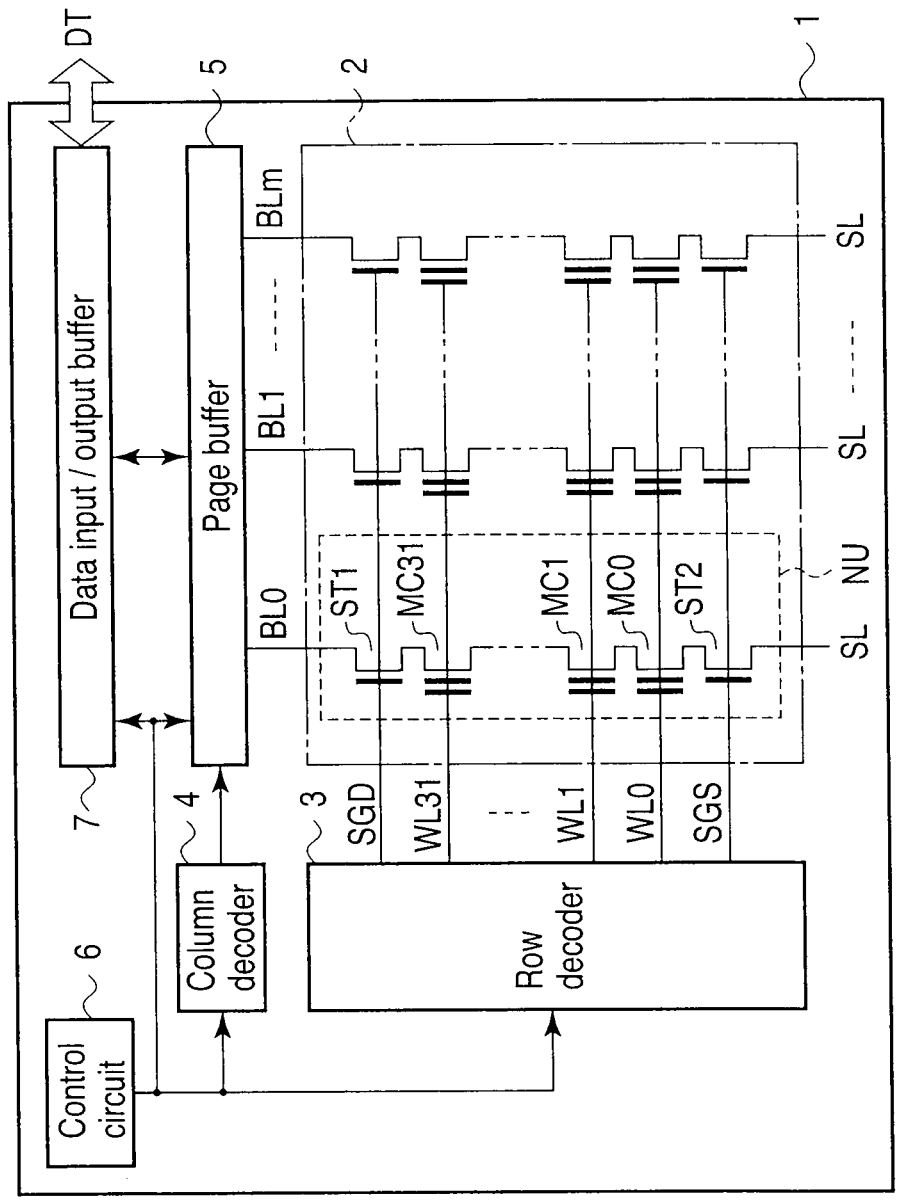
F I G. 1

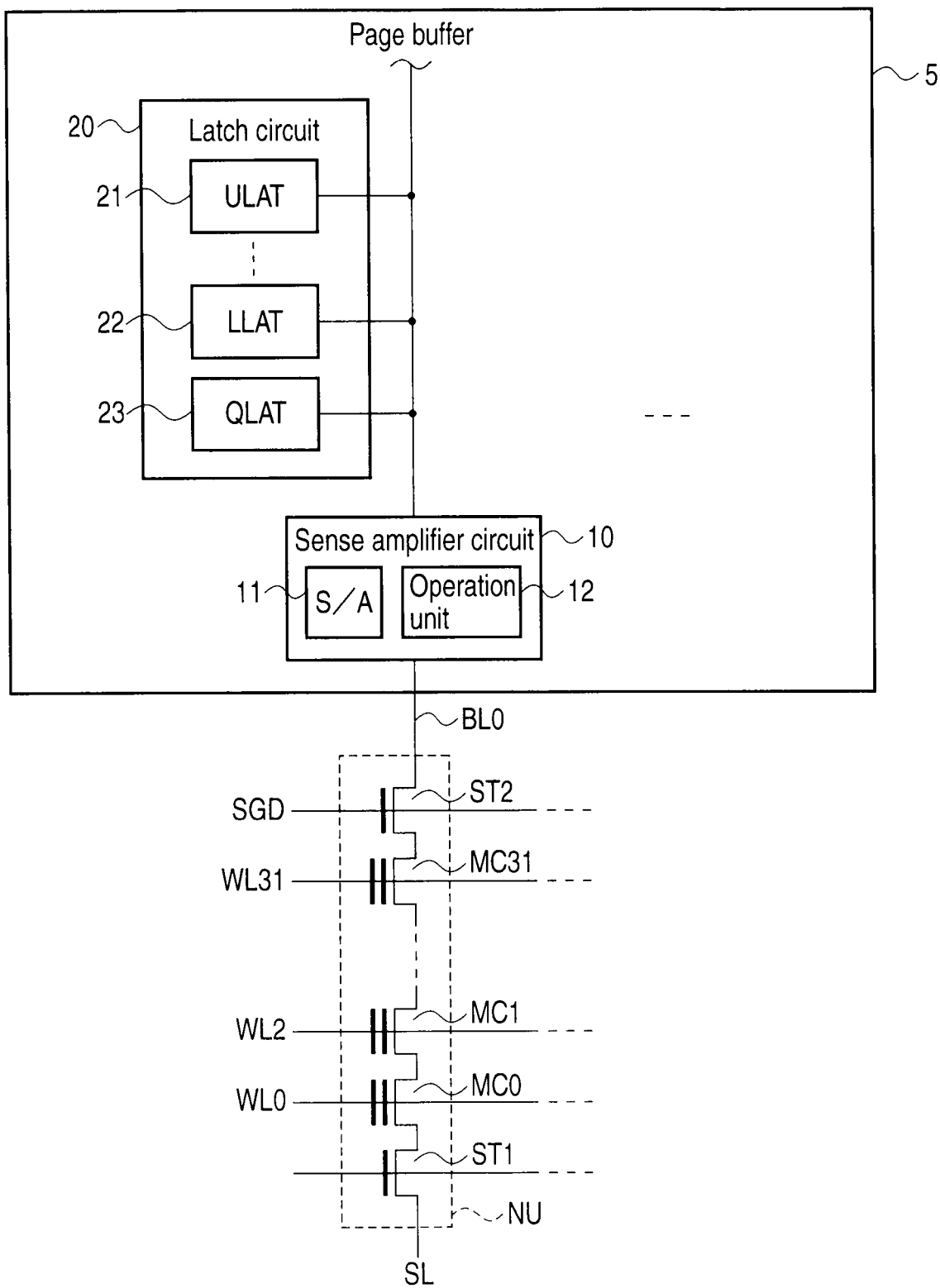
F I G. 2

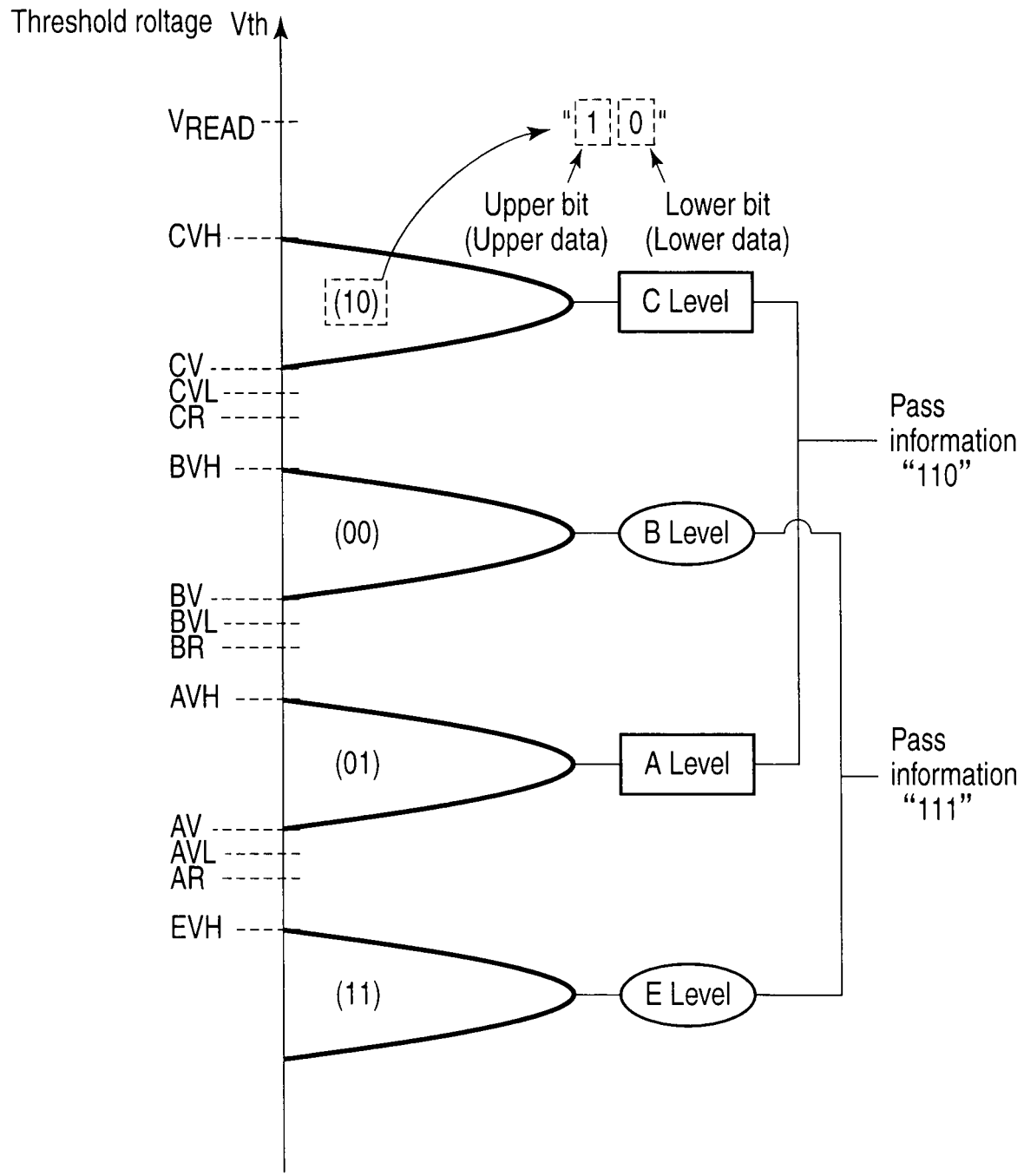
F I G. 3

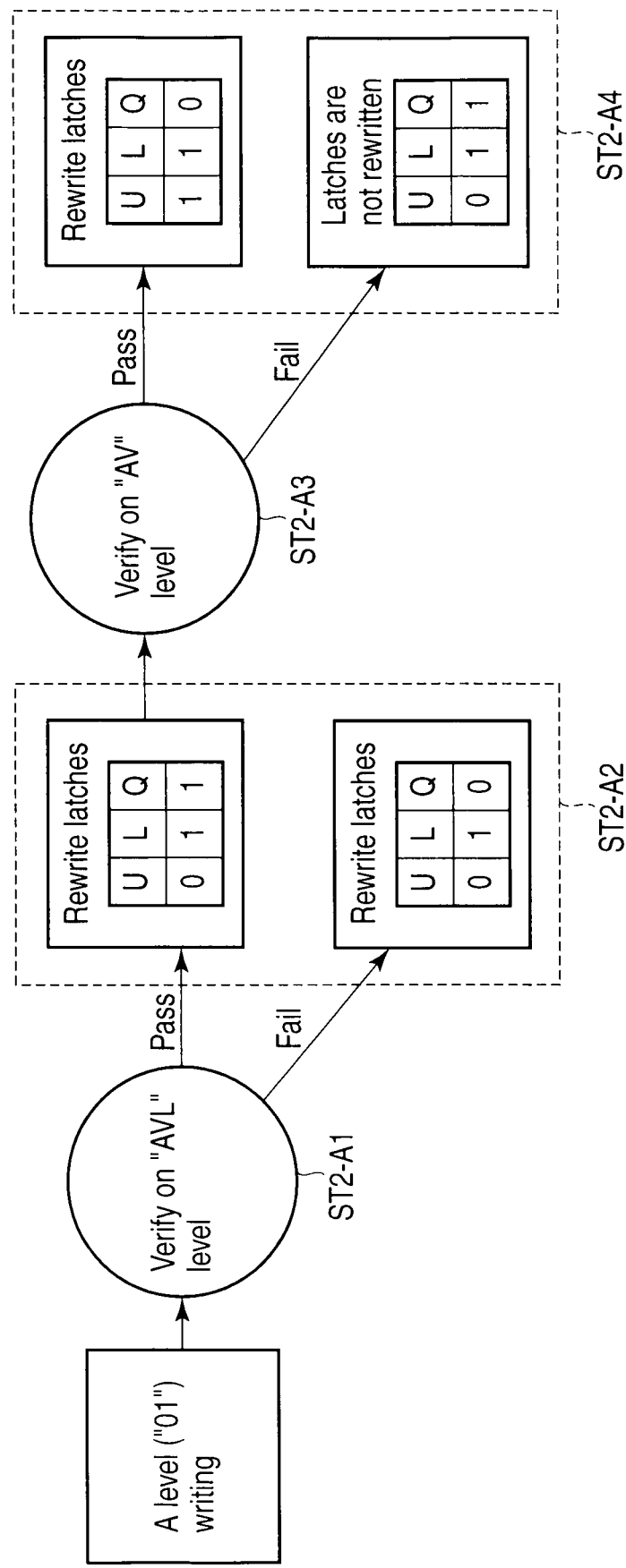
F I G. 5

|  | U | L | Q |
|---|---|---|---|
| "A" level | 1 | 1 | 0 |
| "B" level | 1 | 0 | 1 |
| "C" and "E" level | 1 | 1 | 1 |

⇩

|  | U | L | Q |
|---|---|---|---|
| "A" level |  | 0 | 1 |
| "B" level |  | 1 | 0 |
| "C" and "E" level |  | 1 | 1 |
| Fail cell |  | 0 | 0 |

FIG. 8

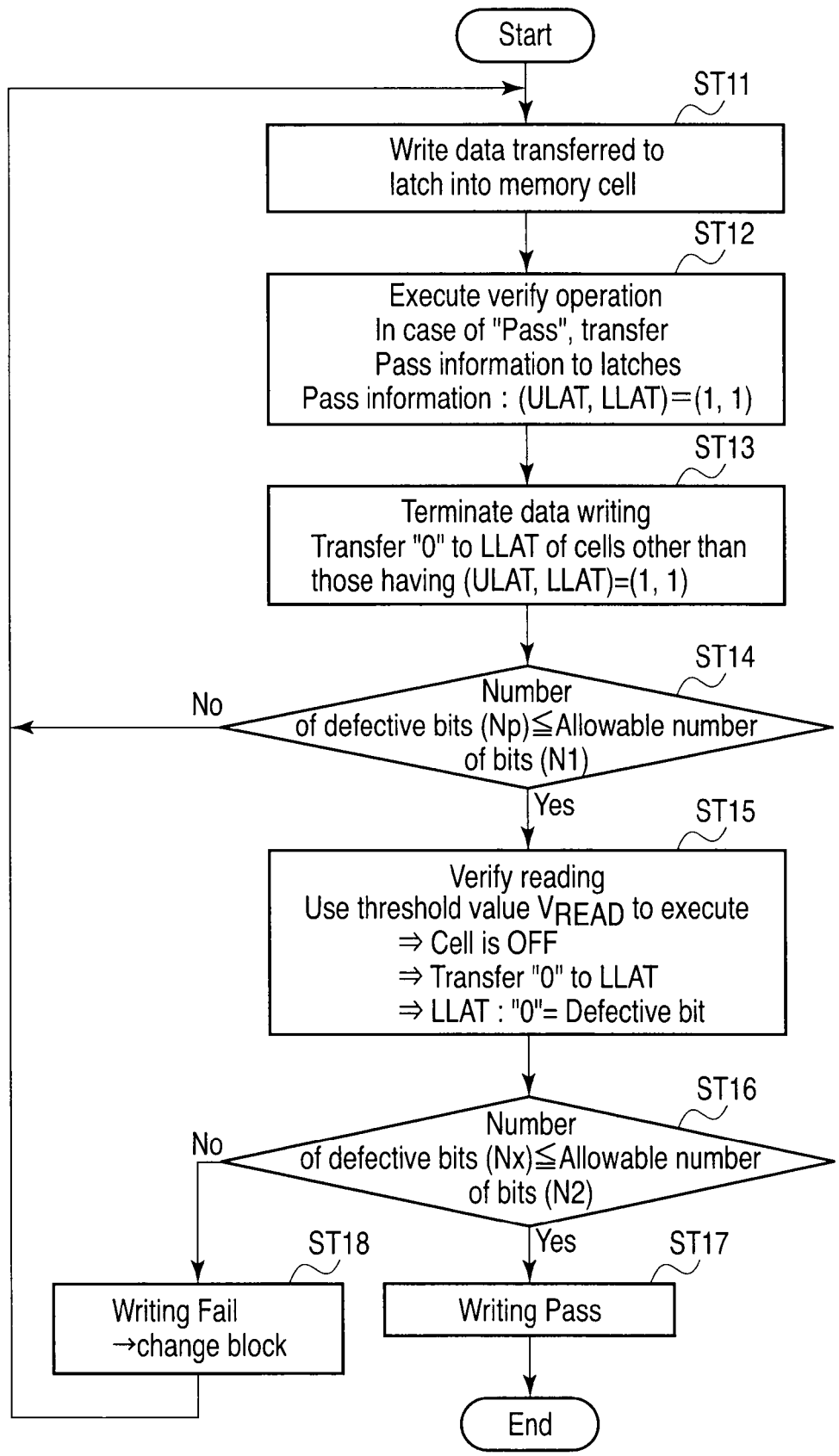
F I G. 9

NONVOLATILE SEMICONDUCTOR MEMORY AND METHOD OF OPERATING THE SAME

CROSS-REFERENCE TO RELATED APPLICATIONS

This application is based upon and claims the benefit of priority from Japanese Patent Application No. 2010-068433, filed Mar. 24, 2010; the entire contents of which are incorporated herein by reference.

FIELD

Embodiments described herein relate generally to a nonvolatile semiconductor memory and method of operating the same.

BACKGROUND

A multi-level NAND type flash memory in which each memory cell can store data consisting of 2 bits or more has been known. Each of 2 or more threshold levels (threshold potentials) set in the memory cells is associated with the data consisting of 2 bits or more.

After data is written in the flash memory as a write sequence, a verify operation of verifying whether predetermined data has been written is executed. The verify operation is executed by determining a given potential level as a criterion and judging whether a threshold level of a memory cell having data written therein is not lower than the predetermined level.

For example, if the threshold level of the memory cell having the data written therein is present at a predetermined level (a threshold distribution) associated with the data, a result of the verify operation in writing is determined to be a success, and the writing into this memory cell is finished. Further, if the threshold level of the memory cell is not present at the predetermined level associated with the data that should be written, a result of the verify operation is determined to be a failure, and the writing into this memory cell is continued.

However, after writing the data or during the verify operation, the threshold level of the memory cell having the successful result of the verify operation fluctuates due to unevenness of characteristics of the memory cells or mutual interference between the cells adjacent to each other. As a result, the threshold level of this memory cell does not fall into the predetermined threshold level (the threshold distribution) associated with the data that should be stored in some cases.

Therefore, it is difficult to detect whether the memory cell having the successful result of the verify operation is truly present in the threshold level range associated with the data that should be stored.

As a result, an erroneous operation of the flash memory, e.g., inexecution of reading data might occur due to a failure in writing data.

BRIEF DESCRIPTION OF THE DRAWINGS

FIG. 1 is a view showing a configuration of a flash memory;
FIG. 2 is a view showing an internal configuration of a page buffer;
FIG. 3 is a view showing threshold distributions of memory cells;
FIG. 5 is a view schematically showing the operation of the flash memory according to the first embodiment;
FIG. 8 is a view for explaining a modification of the flash memory according to the first embodiment;
and
FIG. 9 is a flowchart showing an operation of a flash memory according to a second embodiment.

DETAILED DESCRIPTION

Figure 4:
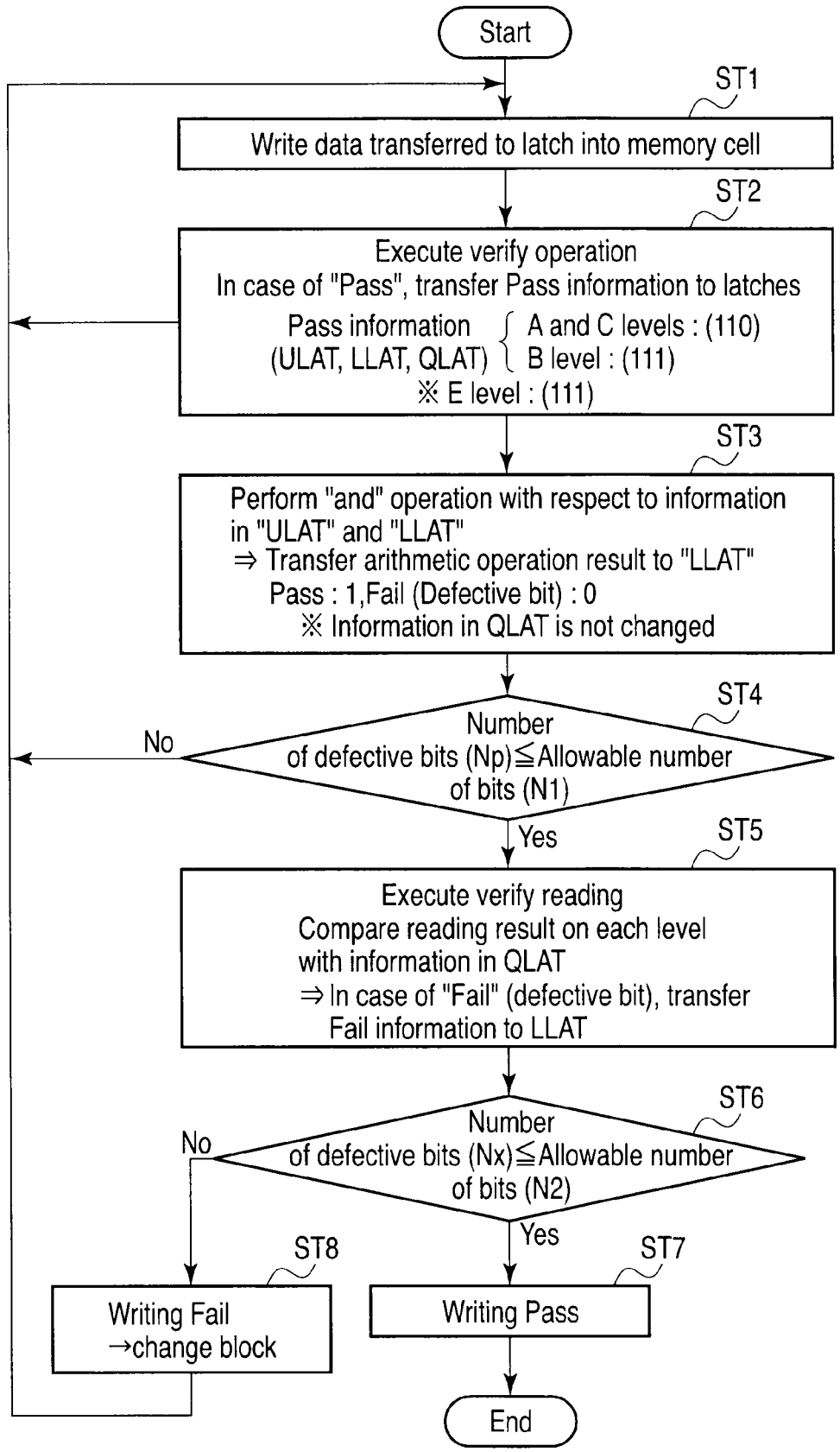
FIG. 4 is a flowchart showing an operation of a flash memory according to a first embodiment.

This embodiment will now be described hereinafter in detail with reference to the accompanying drawings. In the following description, like reference numerals denote elements having the same functions and structures, and a tautological explanation will be given as required.

In general, according to one embodiment, a nonvolatile semiconductor memory includes a plurality of memory cells arranged in a memory cell array in the form of a matrix, the memory cell storing data having two or more levels associated with two or more threshold levels, respectively, a buffer circuit including a plurality of latch circuits and sense amplifier circuits, each latch circuit and each sense amplifier being associated with each column in the memory cell array, and a control circuit configured to control operations of the memory cells and the buffer circuit, the control circuit executing data writing with respect to the memory cells and first verification using judgment information indicative of a result of the data writing in a write sequence with respect to data from the outside. The judgment information is assigned to two or more threshold levels, which are not adjacent to each other, in common.

EMBODIMENTS

(1) First Embodiment (a) Overall Configuration

A nonvolatile semiconductor memory according to a first embodiment will now be described with reference to FIG. 1 to FIG. 3. The nonvolatile semiconductor memory according to this embodiment is, e.g., a flash memory.

FIG. 1 is a block diagram showing a flash memory according to this embodiment.

A flash memory 1 according to this embodiment is an NAND type flash memory.

As shown in FIG. 1, the NAND type flash memory 1 includes a memory cell array 2, a row decoder 3, a column decoder 4, a page buffer 5, a data input/output buffer 7, and a control circuit 6.

As shown in FIG. 1, the memory cell array 2 includes a plurality of NAND cell units (memory cell units) NU. Each of the NAND cell units NU includes, e.g., 32 memory cells MC0 to MC31 and select transistors ST1 and ST2. It is to be noted that the number of the memory cells MC may be, e.g., 8, 16, 64, 128, or 256 without being limited to 32, and this number is not restricted. The memory cells MC0 to MC31 will be generically referred to as memory cells MC when they are not discriminated from each other.

The memory cell MC is a field-effect transistor having a stacked gate structure including a charge storage layer (e.g., a floating gate) formed on a semiconductor substrate to interpose a gate insulating film therebetween and a control gate formed on the charge storage layer to interpose an inter-gate insulating film therebetween. The charge storage layer may be formed by using an insulator as a material. In the memory cells MC, transistors adjacent to each other share a source/a drain. Further, the memory cells MC are arranged in such a manner that their current paths are connected in series between the select transistors ST1 and ST2. One end (a drain) of a plurality of memory cells connected in series (which will be referred to as an NAND string hereinafter) is connected to a source of the select transistor ST1, and the other end (a source) of the NAND string is connected to a drain of the select transistor ST2.

Control gates of the memory cells MC in the same row are connected to any one of word lines WL0 to WL31 in common, and gates of the select transistors ST1 or ST2 in the same row are connected to a select gate line SGD or SGS in common, respectively. The word lines WL0 to WL31 may be simply referred to as word lines WL hereinafter. A drain of the select transistor ST1 is connected to any one of bit lines BL0 to BLm (m is a natural number equal to or above 1). A source of the select transistor ST2 is connected to a source line SL in common. The bit lines BL0 to BLm will be likewise simply referred to as bit lines BL when these lines are not discriminated from each other.

In the above-described configuration, the plurality of NAND cell units NU that use the word lines WL and the select gate lines SGD and SGS in common form a unit called a block. Data in the memory cell transistors MC in the same block are collectively erased. Furthermore, data is collectively written into the plurality of memory cells MC connected to the same word line WL, and this unit is called a page.

Moreover, although FIG. 1 shows one block alone, the plurality of blocks may be provided in a direction parallel to the bit lines BL. In this case, the NAND cell units NU in the same column within the memory cell array 2 are connected to the same bit line BL in common.

The row decoder 3 selects a row direction of the memory cell array 2. The row decoder 3 selects the word line WL based on an address signal input to an address buffer (not shown). Additionally, the row decoder 3 applies predetermined voltages associated with an operation of the flash memory to a selected word line WL and non-selected word lines WL. Voltages applied to the respective word lines WL are generated by, e.g., a potential supply circuit (not shown) provided in a chip. The row decoder 3 includes transfer transistors in association with respective rows in the memory cell array 2. The word lines WL are connected to a charge pump (not shown) in the potential supply circuit through the transfer transistors.

The page buffer (a buffer circuit) 5 temporarily stores write data supplied from the outside and transfers this data to the bit lines BL when writing data. Further, data is collectively written in units of pages. Furthermore, when reading data, the data read to the bit lines BL in units of page is sensed/amplified, temporarily stored by the page buffer 5, and output to the outside.

The data input/output buffer 7 temporarily stores write data and read data to input/output data DT between an external unit (e.g., a controller or a host device) and the memory cell array 2. Data is input/output between the data input/output buffer 7 and the page buffer 5 in response to a request from the outside.

The column decoder 4 selects a column direction of the memory cell array 2. That is, it selects a bit line BL. At the time of reading, the column decoder 4 instructs the page buffer 5 to output data associated with the selected bit line BL.

At the time of writing, the column decoder 4 instructs the page buffer 5 to transfer data to the memory cells MC belonging to a predetermined page.

The control circuit 6 controls overall operations of the NAND type flash memory 1. That is, at the time of, e.g., writing, reading, or erasing data, the control circuit 6 controls operations of the row decoder 3, the column decoder 4, the page buffer 5, and the data input/output buffer 7.

An internal configuration of the page buffer 5 will now be described with reference to FIG. 2. FIG. 2 is a schematic view of the page buffer 5 and the memory cell array 2. It is to be noted that FIG. 2 shows the internal configuration of the page buffer associated with one bit line (one column) for simplicity of the drawing.

In the page buffer 5, sense amplifiers 10 and latch circuits 20 are provided. One sense amplifier circuit 10 and one latch circuit 20 are provided in association with the column in the memory cell array 2. That is, one sense amplifier circuit 10 and one latch circuit 20 are associated with one bit line BL0 and one NAND cell unit NU.

The one sense amplifier 10 is associated with the one NAND cell unit NU. The one sense amplifier circuit 10 is connected to the one bit line BL0. The one latch circuit 20 is also associated with the one NAND cell unit NU like the sense amplifier circuit 10. The latch circuit 20 is connected to the bit line BL0 through the sense amplifier circuit 10.

The sense amplifier circuit 10 and the latch circuit 20 are connected to each of the remaining bit lines BL1 to BLm in the memory cell array 2 like the bit line BL0, respectively.

The sense amplifier circuit 10 has a sense amplifier unit 11 and an operation unit 12.

At the time of reading data, the sense amplifier unit 11 detects and amplifies a potential fluctuation in the bit line BL0 and determines data. The operation unit 12 executes an operation for judging whether data has been written into each memory cell to reach a predetermined voltage level and an operation for judging a state of a threshold value in each memory cell.

The latch circuit 20 temporarily stores data that is to be written into each memory cell, data read out from each memory cell, setting information indicative of an operation for each memory cell (which will be referred to as a flag hereinafter), and others.

The latch circuit 20 has at least two latches 21, 22, and 23. In this embodiment, the latches 21 and 22 that store data are called data latches 21 and 22, and the latch 23 that stores setting information of operations is called a flag latch 23.

The data latches 21 and 22 in the latch circuit 20 store data (data from the outside) that is to be written into the NAND cell unit NU associated with this circuit 20 at the time of writing the data. And they store data (data from the memory cells) read out from the NAND cell unit NU associated with this circuit 20 at the time of reading the data. One data latch stores data of 1 bit. A flag data stored by the flag latch 23 is, e.g., information indicating whether input data is 2-level (1-bit) data or multi-level (2-bit or higher-bit) data or information indicative of a write mode in which data should be written.

For example, when storing four-level (2-bit) data in one memory cell, the latch circuit 20 has the two data latches 21 and 22 and the one flag latch 23. Of the two data latches provided in the latch circuit 20, one upper data latch (ULAT) 21 holds 1 upper bit in the 2 bits, and the other lower data latch (LLAT) 22 holds 1 lower bit in the 2 bits.

It is to be noted that the two data latches and the one flag latch are provided in the latch circuit 20 in the case of 4-level data, but the number of the data latches increases when the number of bits in data rises. For example, in the case of storing 8-level (3-bit) data in the memory cell MC, the latch circuit 20 has three data latches. That is, the latch circuit 20 has a data latch that stores the highest 1 bit, a data latch that stores the lowest 1 bit, and a data latch that stores 1 bit between the highest bit and the lowest bit. Likewise, the number of the data latches in the latch circuit 20 is 4 when data has 16 levels (4 bits), and the number of the data latches in the latch circuit 20 is 5 when data has 32 levels (16 bits). When data has 2 levels (1 bit), the number of the data latches is 1.

The number of the flag latches may be 1, 2 or more in accordance with a memory setting.

In the flash memory according to this embodiment, the data latches and the flag latch in the latch circuit 20 store data and a flag at the time of writing data or reading data, and they also store judgment information indicating whether data has been normally written in the NAND cell unit NU at the time of verification.

Data stored in each memory cell MC will now be described with reference to FIG. 3. FIG. 3 is a graph showing threshold voltages of each memory cell MC, and an ordinate represents a threshold voltage (which will be also referred to as a threshold level or a threshold potential) Vth whilst an abscissa represents an existing probability of each memory cell MC.

As shown in FIG. 3, for example, in a 4-level flash memory, each memory cell MC can store 4-level data. More specifically, the memory cell MC can store 4 types of data on an "E" ("Er") level, an "A" level, a "B" level, and a "C" level in an ascending order of threshold voltages Vth. The "E", "A", "B", and "C" levels are associated with, e.g., data "11", "01", "00", and "10" in binary display, respectively. Each bit in such 2-bit data is called an upper bit (or upper data) or a lower bit (lower data) as shown in FIG. 3. It is to be noted that a relationship between the "E" to "C" levels and the data "00" to "11" is not restricted to that depicted in FIG. 3, and the relationship can be appropriately selected.

The "E" (Erase) level is an erase level, and its threshold voltage VthE has a relationship of VthE<AR. A threshold voltage VthA of the "A" level has a relationship of AR<VthA<BR. A threshold voltage VthB of the "B" level has a relationship of BR<VthB<CR. A threshold voltage VthC of the "C" level has a relationship of $CR<VthC<V_{READ}$.

In this embodiment, a memory cell whose data stored therein is on the "C" level is called a '"C" level cell'. A memory cell whose data stored therein is on the "B" level is called a '"B" level cell'. A memory cell whose data stored therein is on the "A" level is called an '"A" level cell'. Furthermore, a memory cell that is on the "E" level (an erased state) is called an '"E" level cell'.

In this embodiment, writing data associated with the "C" level is called '"C" writing'. Moreover, writing data associated with the "B" level is called '"B" writing'. Additionally, writing data associated with the "A" level is called '"A" writing'. It is to be noted that the "E" level is the erase level. Therefore, writing data associated with the "E" level is an erase operation, but it is called "E" writing as required.

The potentials $V_{READ}$, CR, BR, and AR are potentials that are used for reading data based on a read command or reading data for verification. In this embodiment, reading data that is performed using the potential (a read level) CR as a read level (i.e., a judgment upon whether a threshold level is the "C" level or the "B" level) is called '"C" reading'. Further, reading data performed using the potential BR (i.e., a judgment upon whether a threshold level is the "B" level or above or the "A" level or below) is called '"B" reading'. Furthermore, reading data performed using the potential AR (i.e., a judgment upon whether a threshold level is the "A" level or above or the "E" level) is called '"A" reading'. Before a write sequence associated with a write command is finished, a verify operation using these read levels (which will be referred to as verify reading hereinafter) is executed. In this embodiment, one write sequence includes data writing and subsequent data reading for verification (the verify reading). It is to be noted that, in the verify reading, a read command does not have to be input from the outside.

Data is collectively written into or read out from the memory cells MC connected to the same word line WL. At this time, the data is written or read out in accordance with each lower bit or each upper bit. Therefore, when each memory cell MC stores 2-bit data, 2 pages are assigned per word line WL. A page into or from which data is collectively written or read with regard to the lower bit will be referred to as a lower page, and a page into or from which data is collectively written or read with regard to the upper bit will be referred to as an upper page.

Writing of the multi-level flash memory has, e.g., an LM (Lower at Middle) mode or a QPW (Quick Pass Write) mode. Although a description will be given as to an example where the QPW mode is used for writing data, the flash memory according to this embodiment can be also applied to any other write mode.

In the QPW mode, at the time of writing data, a predetermined intermediate potential is supplied to the bit line, and whether a threshold voltage of a selected memory cell (which will be referred to as a selected cell hereinafter) falls within a threshold distribution associated with the data to be written is judged (verified), whereby a threshold value of the memory cell is shifted to fall within a predetermined range. As a result, the threshold distribution of the memory cell with respect to predetermined data is narrowed. In the QPW mode, the flag stored by the flag latch is also called QPW information.

In the QPW mode, a threshold level on a higher potential side and a threshold level on a lower potential side in each threshold level distribution are set as potential levels serving as criteria for the verify operation.

In a threshold distribution of the "C" level, a judgement level "CVH" ($<V_{READ}$) is set with respect to a level at a high potential end of this distribution and a judgment level "CV" (>CR) is set with respect to a level at a low potential end of this distribution as the criteria for the verify operation. In a threshold distribution of the "B" level, a judgment level "BVH" (<CR) is set with respect to a level at a high potential end of this distribution and a judgment level "BV" (BVH>BV>BR) is set with respect to a level at a low potential end of this distribution as the criteria for the verify operation. In a threshold distribution of the "A" level, a judgment level "AVH" (<BR) is set with respect to a level at a high potential end of this distribution and a judgment level "AV" (AVH>AV>AR) is set with respect to a level at a low potential end of this distribution as the criteria for the verify operation. Further, in a threshold distribution of the "E" level, a level "EVH" (<AR) at a high potential end of this distribution is set as the criterion for the verify operation.

Furthermore, another judgment level is set between the read level and the judgment level at the low potential end of the threshold distribution with respect to each threshold level.

In the "C" level, a judgment level CVL is set between the read level CR and the judgment level CV. In the "B" level, a judgment level BVL is set between the read level BR and the judgment level BV. In the "A" level, a judgment level AVL is set between the read level AR and the judgment level AV.

In each threshold level, the judgment levels CVH, BVH, and AVH will be referred to as a "CVH" level, a "BVH" level, and an "AVH" level hereinafter, respectively. The judgment levels CVL, BVL, and AVL will be referred to as a "CVL"

level, a "BVL" level, and an "AVL" level hereinafter, respectively. Moreover, the judgment levels CV, BV, and AV will be referred to as a "CV" level, a "BV" level, and an "AV" level hereinafter, respectively.

In the flash memory using the QPW mode, during writing data, each of the above-described judgment levels is utilized to verify whether the write data input from the outside has been written into a predetermined memory cell.

The verify operation is executed when, e.g., the control circuit 6 controls operations of the row/column decoders 3 and 4 and the page buffer 5 and utilizes the judgment level and the read level to judge whether a threshold voltage of the memory cell having the data written therein is present in the range of the threshold distribution associated with the write data.

A result of the verify operation, which is Pass or Fail, can be obtained when, e.g., the control circuit 6 or the operation unit 12 in the sense amplifier circuit 10 included in the page buffer 5 executes an arithmetic operation with respect to the threshold level of the memory cell and data stored by the latch circuit 20. When a result of the verify operation is Pass, information indicating that data writing is Pass (which will be referred to as Pass information hereinafter) is output from the operation unit 12 or the control circuit 6. When a result of the verify operation is Fail, information indicating that data writing is Fail is output from the operation unit 12 or the control circuit 6. When a result of the verify operation is not restricted to either Pass or Fail, this result will be referred to as Pass/Fail information or simply judgment information.

The verify operation is sequentially executed in accordance with each threshold level.

As shown in FIG. 3, in the flash memory according to this embodiment, pieces of information used for determining whether writing data has been performed are assigned to the plurality of threshold levels associated with the data in such a manner that two or more threshold levels that are not adjacent to each other can have the same information.

In the example depicted in FIG. 3, in the verify operation at the time of writing data in the QPW mode, the same judgment information (which is also referred to as the Pass information) is assigned to a group including a "C" level cell and an "A" level cell that have passed the verification, and the same judgment information is assigned to a group including a "B" level cell and an "E" level cell that have passed the verification. In the example depicted in FIG. 3, the judgment information for the "C" and "A" level cells is set to, e.g., "111". The judgment information for the "B" and "E" level cells is set to, e.g., "110".

The data latches 21 and 22 that temporarily store data to be written and the flag latch 23 that temporarily stores a flag data are overwritten with these pieces of judgment information, whereby the judgment information can be stored in the chip 1.

As to the Pass information for the group including the "C" and "A" level cells, in the latch circuit 20 associated with each of the "C" and "A" level cells, for example, "1" is stored in the upper data latch (ULAT) 21, "1" is stored in the lower data latch (LLAT), and "1" is stored in the flag latch (QLAT). As to the Pass information for the group including the "B" and "E" level cells, in the latch circuit 20 associated with each of the "B" and "E" level cells, for example, "1" is stored in the upper data latch (ULAT) 21, "1" is stored in the lower data latch (LLAT), and "0" is stored in the flag latch (QLAT).

In the judgment information, "11" (success code, second code) stored in the upper and lower data latches 21 and 22 indicates that the writing has been successful. Furthermore, "1" (data code, first code) stored in the flag latch 23 is indicative of the "C" and "A" level cells, and "0" (data code, first code) stored in the flag latch 23 is indicative of the "B" and "E" level cells. As described above, in this embodiment, when the writing has been determined to have the Pass result, different pieces of judgment information are set to two threshold levels that are adjacent to each other, such as the "A" level and the "B" level.

Furthermore, the control circuit 6 (or the operation unit 12) in the flash memory 1 compares the Pass information assigned to the respective threshold levels that are not adjacent to each other. Then, control circuit 6 judges whether predetermined data that should be written into a predetermined memory cell has been written by a result of the verify reading. A result of this comparison is transferred to the latch circuit 20 under control of the control circuit 6, whereby the judgment information in the data latches 21 and 22 is rewritten with the transferred comparison result.

In the flash memory 1 according to this embodiment, for example, if a result of the comparison between the judgment information and the verify reading is Fail, this Fail information is written into the lower data latch (LLAT) 22.

As a result, whether the number of defective bits in data writing meets a tolerance for defects is judged. Moreover, when allowable conditions in the data writing are met, the write sequence for a given selected word line (a page) or block is completed.

When the one write sequence is completed, a write sequence for another word line or another block is executed. Generally, in a write operation in the NAND type flash memory, selected word lines are switched in an order from a source line side toward a bit line side, and the write sequence proceeds.

As described above, in the flash memory according to this embodiment, the common judgment information set to (assigned to) two or more threshold levels that are not adjacent to each other is utilized to verify whether data that should be written has been written in a predetermined memory cell.

In a general flash memory cannot detect as a data error following situation, even if data read out by verify reading is different from data that should be stored. When a threshold value of a memory cell in which given data writing has been completed changes to a level higher than its threshold level or when a threshold level of a memory cell in which predetermined data writing has been completed changes to another level due to data writing in an adjacent memory cell.

In the flash memory according to this embodiment, a plurality of threshold levels (threshold distributions) that are not adjacent to each other is determined as one group. And information indicative of Pass/Fail of writing (verification) and information indicative of data that should be written are set to this group as judgment information representing whether writing has been performed. As a result, even if a defect that a threshold level of a memory cell into which data on the "A" level should be written changes to a threshold level on the "B" level due to, e.g., intercell interference or disturbance in reading during the verify reading occurs during an operation of the memory, such a defect can be detected. Therefore, in the flash memory according to this embodiment, the reliability of the memory can be improved.

Data that is not required to be stored by the latches is overwritten with the judgment information set in the flash memory according to this embodiment. That is, setting information is stored in the existing data latches 21 and 22 and the flag latch 23 provided in the page buffer 5.

Therefore, in the flash memory according to this embodiment, even if new judgment information is set, a new storage element does not have to be provided to store this judgment information. Hence the number of latches included in the page buffer is not increased. Accordingly, in the flash memory 1 according to this embodiment, the reliability of the flash memory can be improved without changing the circuit configuration and increasing a circuit scale.

Additionally, to judge whether data writing has been performed without using such judgment information as that in this embodiment and without increasing the number of latches in the memory chip, an external controller may be used. In this case, after terminating a write operation, data stored by the external controller is transferred to the memory chip, and the transferred data is compared with data read from the memory cell in the chip. Alternatively, as a converse case, the data read from the memory cell is transferred to the external controller, and the data stored by the controller is compared with the data transferred from the memory chip in the external controller.

Like these cases, when the external controller is utilized to verify whether predetermined data has been written, a data reading time in the chip or a data transfer time between the memory chip and the external controller is produced. Further, even after data from the outside has been written into a memory cell, the controller keep the data from the outside. Therefore, an operating speed of the flash memory is reduced.

In the flash memory according to this embodiment, the judgment information common to two or more threshold levels that are not adjacent to each other can be utilized to judge whether data writing has been effected by internal processing of the chip, thereby suppressing the operating speed from being reduced.

Furthermore, if an ECC (Error Checking and Coding) circuit is provided in the chip to remedy a defective bit that cannot be detected by conventional verify reading, the circuit scale of the memory increases.

On the other hand, in the flash memory according to this embodiment, setting the judgment information common to two or more threshold levels that are not adjacent to each other enables detecting a defective bit that cannot be detected by the conventional technology.

As described above, in the flash memory according to this embodiment, to improve the reliability of data writing, the circuit scale in the chip does not have to be increased, and the external controller does not have to be utilized either.

Therefore, according to the flash memory according to the first embodiment, the reliability of the memory can be improved without changing the circuit configuration.

(b) Operation

An operation of the flash memory according to this embodiment will now be described with reference to FIG. 4 to FIG. 7. It is to be noted that the operation of the flash memory according to this embodiment will be explained with reference to FIG. 1 to FIG. 3 as required. Here, an example where a write mode of the flash memory is the QPW mode will be described.

As shown in FIG. 4, data is input together with a data write command and an address signal to the data input/output buffer 7 in the flash memory 1. The input data is transferred from the data input/output buffer 7 to the latch circuit 20 in the page buffer 5 under control of the control circuit 6. Furthermore, writing the transferred data begins (a step ST1).

It is to be noted that an erase operation is executed with respect to a selected block before the data from the outside is transferred to the page buffer 5. Memory cells in this block are "E" level cells. Based on this erase operation, the data latches 21 and 22 in the latch circuit 20 store data "11", and the flag latch 23 in the same stores data "1".

When the data transferred to the page buffer 5 is 4-level (2-bit) data, an upper bit of the data is input to the upper data latch (ULAT) 21 in the latch circuit 20, and a lower bit of the data is input to the lower data latch (LLAT) 22 in the latch circuit 20.

When the data transferred to the page buffer 5 is 2-level (1-bit) data, the data is input to the lower data latch (LLAT) 22 in the latch circuit 20. Moreover, a flag data indicative of writing the 2-level data is input to the flag latch (QLAT) 23 in the latch circuit 20.

The data from the outside is input to the data latches 21 and 22 associated with each memory cell into which this data is written. The data is not input to the data latch associated with a memory cell into which the data does not have to be written, i.e., which is keeping an erased state (the "E" level), and these data latches 21 and 22 store the data "11".

Additionally, the control circuit 6 selects a word line (a page) indicated by the address signal and activates the selected word line (which will be referred to as a selected word line hereinafter). The control circuit 6 transfers the data stored by the latch circuit 20 to the sense amplifier circuit 10. The sense amplifier circuit 10 adjusts a potential in the bit line BL in accordance with this data.

The control circuit 6 controls operations of the row/column decoder 3 and 4 and the page buffer 5 to sequentially write the data stored by the latches 21 and 22 into the memory cells belonging to the page in accordance with each threshold level associated with the data in the QPW mode, for example. The data may be written in an order of "A" ("01"), "B" ("00"), and "C" ("10") or in a different order.

After the data is written in the predetermined memory cells (the page), a verify operation is executed (a step ST2). It is to be noted that the verify operation in this example may be executed every time writing the data into one page is finished, or it may be sequentially executed in accordance with each page having the data written therein after writing the data into the plurality of pages is finished.

The verify operation at this step ST2 is executed with the "AVL", "BVL", and "CVL levels and the "AV", "BV", and "CV" levels being used as criteria. However, the "AVH", "BVH", and "CVH" levels may be used as verify judgment levels. When the "AVL to CVL" levels and the "AVH to CVH" levels are used for performing the verify operation, the threshold distribution range can be narrowed, and an accuracy of data writing can be improved.

In the verify operation, the "AVL to CVL" levels and the "AV to CV" levels are applied to the selected word line, respectively, and whether memory cells connected to the selected word line (memory cells belonging to a given page) are turned on is judged based on this application of potentials. The control circuit 6 or the operation unit 12 in the sense amplifier circuit 10 compares a potential fluctuation in a bit line as this ON/OFF result with data stored by each latch circuit, thereby judging whether a verification result is Pass or Fail.

The verify operation is executed in an order of, e.g., the "A" level, the "B" level, and the "C" level.

The verify operation on the "A" level will now be described with reference to FIG. 5. FIG. 5 is a view schematically showing the verify operation in the flash memory according to this embodiment.

The "A" level is associated with data "01". Therefore, the upper/lower data latches (ULAT and LLAT) 21 and 22 associated with the memory cells in which the "A" level data is written store data "0" and data "1", respectively.

In the verify operation for the "A" level, the verify operation on the "AVL" level is first executed (a step ST2-A1). A verify result on the "AVL" level is transferred to the latch circuit 20 in which the upper/lower data latches 21 and 22 indicate the "A" level (the data "01"). The judgment and the transfer of this verify result are executed by, e.g., the control circuit 6 and the operation unit 12 in the sense amplifier circuit 10.

When a verify result using the "AVL" level with respect to a given memory cell is Pass (when the memory cell is OFF), for example, "1" is transferred to the latch circuit 20 which is associated with the memory cell having the Pass result and in which data stored by the data latches (ULAT and LLAT) 22 and 23 is "01". When a verify result using the "AVL" level with respect to a given memory cell is Fail (when the memory cell is ON), for example, "0" is transferred to the latch circuit 20 which is associated with the memory cell having the Fail result and in which data stored by the data latches (ULAT and LLAT) is "01".

Moreover, data stored by the flag latch (QLAT) 23 in the latch circuit 20 is rewritten with the verify result on the "AVL" level from the flag information (a step ST2-A2). After writing the data, since the data stored by the flag latch 23 is not used during the verify operation, it is possible to rewrite the flag data.

That is, when the result of the verify operation on the "AVL" level is Pass (writing has been successful), the data stored by the flag latch 23 associated with the "A" level cell is rewritten with "1". On the other hand, when the result of the verify operation on the "AVL" level is Fail (writing has failed or has been uncompleted), the data stored by the flag latch 23 is rewritten with "0". For example, the data in the upper/lower data latches 21 and 22 is not rewritten, and the "A" level data ("01") is kept.

In the verify operation on the "A" level, the verify operation on the "AV" level is executed (a step ST2-A3). Here, the verify operation on the "AV" level may be executed with respect to memory cells that have passed the verify operation on the "AVL" level (QLAT="1") alone. Furthermore the verify operation on the "AV" level may be executed with respect to both memory cells that have passed the verify operation or memory cells that have not passed the same. For example, the control circuit 6 or the operation unit 12 makes reference to data stored by the flag latch to select whether the verify operation on the "AV" level is to be executed.

When a result of the verify operation on the "AV" level is Pass, for example, judgment information of "110" (Pass information in this example) is transferred to the latch circuit 20 which is associated with each memory cell having a Pass result and in which data stored by the data latches (ULAT and LLAT) 21 and 22 is "01". Then, the judgment information is written into each latch in the latch circuit 20 (a step ST2-A4). Therefore, in the latch circuit 20 associated with each memory cell having the "A" level data written therein, for example, data in the upper data latch 21 is rewritten with "1", data in the lower data latch 22 is rewritten with "1", and data in the flag latch 23 is rewritten with "0".

When a result of the verify operation on the "AV" level is Fail, the judgment result of the verify operation is not transferred to the latch circuit 20, and respective pieces of data stored by the data latches (ULAT and LLAT) 21 and 23 and the flag latch 23 are maintained as they are.

As described above, in the verify operation with respect to the "A" level, the latch circuit associated with the memory cells having the Pass result of the verify operation (which will be referred to as Pass cells hereinafter) stores "110". On the other hand, in the verify operation with respect to the "A" level, the latch circuit associated with the memory cells having a Fail result of the verify operation (which will be referred to as Fail cells hereinafter) stores data "010" or "011". It is to be noted that data writing may be again executed with respect to the Fail cells, and hence it is preferable for the data in the data latches 21 and 22 to be unchanged.

After the verify operation with respect to the "A" level, a verify operation for the "B" level is executed.

Figure 6:
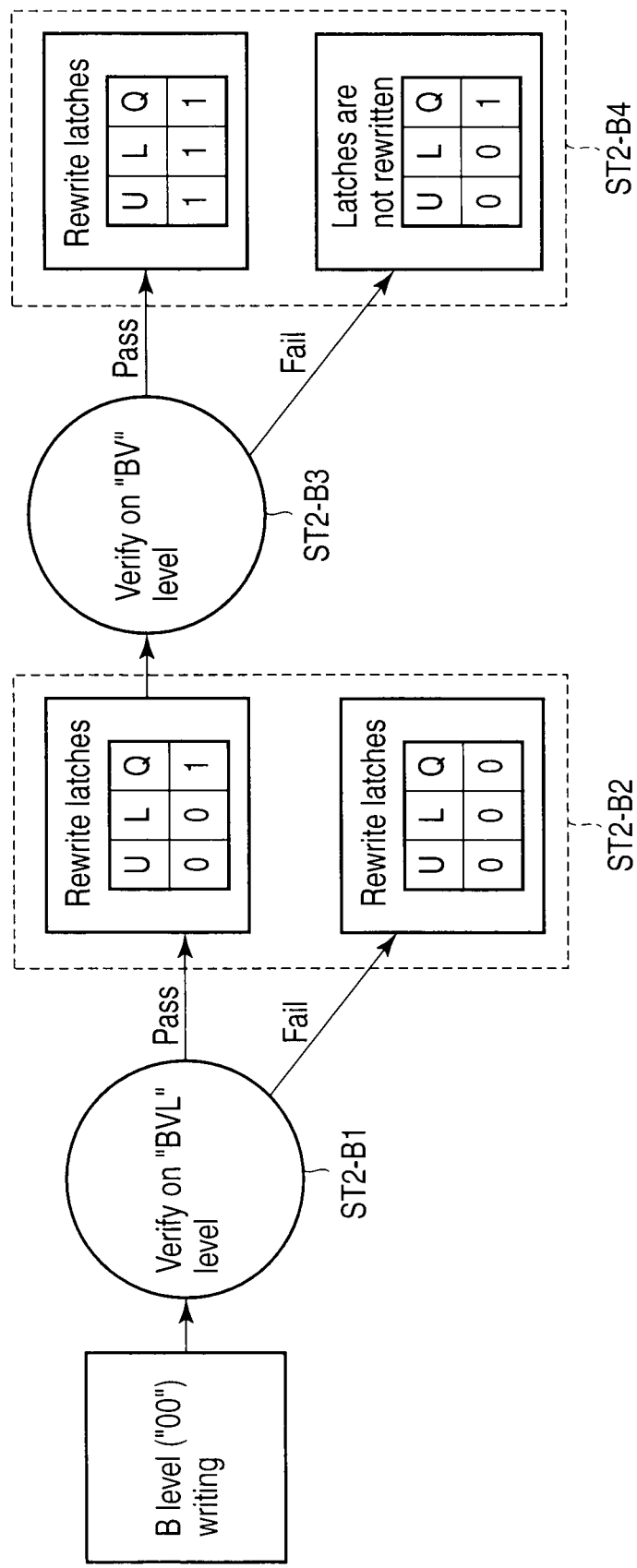
FIG. 6 is a view schematically showing the operation of the flash memory according to the first embodiment.

The verify operation for the "B" level will now be described with reference to FIG. 6. FIG. 6 is a view schematically showing the verify operation for the "B" level in the flash memory according to this embodiment. It is to be noted that the operation substantially equal to the verify operation for the "A" level will be described as required.

The "B" level is associated with data "00". Therefore, the upper/lower data latches (ULAT and LLAT) 21 and 22 associated with each memory cell into which "B" level data is written store data "0" and data "0", respectively.

As shown in FIG. 6, in the verify operation for the "B" level, the verify operation on the "BVL" level is first executed (a step ST2-B1). A verify result on the "BVL" level is transferred to the latch circuit 20 in which the upper/lower data latches 21 and 22 indicate the "B" level.

When a verify result on the "BVL" level with respect to a given memory cell is Pass, for example, "1" is transferred to the latch circuit 20 which is associated with the memory cell having a Pass result and in which the data latches 22 and 23 store data "00". When a verify result using the "BVL" level with respect to a given memory cell is Fail, for example, "0" is transferred to the latch circuit 20 which is associated with the memory cell having the Fail result and in which data stored by the data latches is "00".

Further, data in the flag latch (QLAT) 23 in the latch circuit 20 is rewritten to the verify result on the "BVL" level from the flag data (a step ST2-B2).

The data in the flag latch 23 associated with the Pass cell on the "BVL" level is rewritten to "1". On the other hand, the data in the flag latch 23 associated with the Fail cell on the "BVL level is rewritten to "0". For example, the data in the data latches 21 and 22 is not rewritten, and the "B" level data continuously keeps. Like the verify operation on the "A" level, initial data in the flag latch is not used in the verify operation on the "B" level, and hence it is possible to rewrite the flag data.

After the verify operation on the "BVL" level, the verify operation on the "BV" level is executed (a step ST2-B3).

When a result of the verify operation on the "BV" level is Pass, for example, "111" is transferred to the latch circuit 20 which is associated with the memory cell having the Pass result and in which data stored in the data latches (ULAT and LLAT) 21 and 22 is "00". Therefore, in the latch circuit 20 associated with the "B" level cell, for example, the data in the upper data latch 21 is rewritten with "1", the data in the lower data latch 22 is rewritten with "1", and the data in the flag latch 23 is rewritten with "1".

When a result of the verify operation on the "BV" level is Fail, the judgment result of the verify operation is not transferred to the latch circuit 20, and the respective pieces of data stored in the data latches (LLAT and LLAT) 21 and 23 and the flag latch 23 are maintained as they are.

As described above, in the verify operation with respect to the "B" level, the latch circuit associated with the Pass cell stores "111". On the other hand, in the verify operation with respect to the "B" level, the latch circuit 20 associated with the Fail cell stores the data "000" or "001".

As shown in FIG. 3, the "A" level and the "B" level are threshold levels (the threshold distributions) adjacent to each other. On such threshold levels adjacent to each other, the judgment information ("110") on the "A" level is set to be different from the judgment information ("111") on the "B" level as shown in FIG. 6.

After the verify operation on the "B" level, a verify operation on the "C" level is executed.

The substantial verify operation on the "C" level is the same as the verify operation on the "A" level (see FIG. 5) except for a threshold level for judging Pass/Fail of the verify operation.

The "C" level is associated with data "10". Therefore, the upper/lower data latches (ULAT and LLAT) 21 and 22 associated with each memory cell into which "C" level data is written store data "1" and data "0", respectively.

In the verify operation for the "C" level, the verify operation on the potential level "CVL" is first executed. A verify result on the "CVL" level is transferred to the latch circuit 20 in which the upper/lower data latches 21 and 22 indicate the "C" level.

When the verify result using the "CVL" level with respect to a given memory cell is Pass, for example, "1" is transferred to the latch circuit 20 which is associated with the memory cell having the Pass result and in which the data stored in the data latches 22 and 23 is "10". When a verify result using the "CVL" level with respect to a given memory cell is Fail, for example, "0" is transferred to the latch circuit 20 which is associated with the memory cell having the Fail result and in which the data stored in the data latches is "10". Furthermore, the data stored by the flag latch (QLAT) 23 in the latch circuit 20 is rewritten with the verify result on the "CVL" level.

That is, the data in the flag latch 23 associated with the Pass cell on the "CVL" level is rewritten with "1". On the other hand, the data in the flag latch 23 associated with the Fail cell on the "CVL" level is rewritten with "0". For example, the data in the data latches 21 and 22 is not rewritten, and the "C" level data ("10") is continuously stored as it is.

Therefore, in the verify operation on the "CVL" level, the latch circuit 20 associated with the Pass cell stores data "101", and the latch circuit 20 associated with the Fail cell stores the data "100".

After the verify operation on the "CVL" level, a verify operation on the "CV" level is executed.

When a result of the verify operation on the "CV" level is Pass, for example, judgment information of "110" is transferred to the latch circuit 20 in which the data latch circuits 21 and 22 store data "10". Accordingly, in the latch circuit 20 associated with a "C" level cell having a Pass result, for example, data in the upper data latch 21 is rewritten with "1", data in the lower data latch "22" is rewritten with "1", and data in the flag latch 23 is rewritten with "0".

When a result of the verify operation on the "CV" level is Fail, the result of the verify operation is not transferred to the latch circuit 20, and respective pieces of data stored by the data latches (ULAT and LLAT) 21 and 23 and the flag latch 23 are maintained as they are.

As described above, in the verify operation for the "C" level, the latch circuit 20 associated with the "C" level cell having the Pass result stores "110". On the other hand, in the verify operation for the "C" level, the latch circuit 20 associated with "C" level cell having the Fail result stores data "100" or "011".

Therefore, in the flash memory according to this embodiment, Pass information of the "C" level cell that has passed the verify operation on the "C" level (the verify operation using the "CVL"-"CV" level) is equal to Pass information of the "A" level that has passed the verify operation on the "A" level (the verify operation using the "AVL"-"AV" level).

Furthermore, in the flash memory according to this embodiment, at the time of writing data, when the data latches store data "11", data is not written into each memory cell associated with the data latches. Therefore, at the start of writing data, when the data in the data latches 21 and 22 is "11", data writing is not executed with respect to each memory cell associated with this latch circuit 20 as each "E" level cell. Moreover, a verify operation on the "E" level is not executed either. Additionally, the flag latch 23 stores data "1".

As described above, the latch circuit 20 associated with each "E" level cell into which data is not written (which maintains an initial state) is set to store data "111". That is, in the latch circuit 20 associated with the "E" level cell, the upper data latch 21 stores the data "1", the lower data latch 22 stores the data "1", and the flag latch 23 stores the data "1".

In this manner, judgment information of the "E" level cell is equal to the judgment information of the "B" level cell. As described above, the judgment information of the "C" and "A" level cells (information of the flag latch 23) is different from the judgment information of the "B" and "E" level cells. According to this embodiment, in Pass information of a memory cell that stores 4-level data, the memory cell that can take four types of threshold voltages can be represented by data of 1 bit ("0" or "1").

Here, data may be again written so that a threshold value of a memory cell having a Fail result can be a threshold level of data that should be written. However, potentials of a bit line and a channel are adjusted to prevent data from being written into each Pass cell.

After executing the data writing (application of a write voltage) and the verify operation a predetermined number of times, in each column, information (a first judgment bit) stored by the upper data latch 21 and information (a second judgment bit) stored by the lower data latch 22 are subjected to arithmetic processing by, e.g., the control circuit 6 or the operation unit 12 (a step ST3). This arithmetic processing is, e.g., an "and" operation.

In the case of the data latches associated with a Pass cell, since information in the upper/lower latches is "11", a result of the "and" operation is "1". In the case of the data latches associated with a Fail cell, since at least one of the upper and lower data latches stores information "0", a result of the "and" operation is "0". This operation result is written into, e.g., the lower data latch (LLAT) 22. Since the information stored by the data latches is data indicating that writing is Pass or Fail, it is possible to be rewritten the data in data latches after the "and" operation.

It is to be noted that, even if the "and" operation is executed to rewrite the information in the data latches, since information stored by the flag latch 23 is information indicative of a threshold level of a memory cell associated with data from the outside, this information is not changed. Therefore, the flag latch 23 associated with the "C" and "A" level cells having a Pass writing result stores information "0". Additionally, the flag latch 23 associated with the "B" and "E" levels having a Pass writing result stores information "1". In this manner, the same judgment information is assigned to threshold levels that are not adjacent to each other, and different types of judgment information are assigned to threshold levels that are adjacent to each other. The latch circuit associated with each memory cell stores the judgment information.

Therefore, information stored by the lower/flag latches (LLAT and QLAT) 22 and 23 associated with the "C" and "A" level cells having a Pass writing result is "10". Information stored by the lower/flag latches (LLAT and QLAT) 22 and 23 associated with the "B" and "E" level cells having a Pass writing result is "11".

The judgment information common to threshold levels that are not adjacent to each other is associated with a result of data writing. The judgment information common to threshold levels includes, e.g., information indicating that data writing is Pass or Fail and information indicative of data stored in each memory cell at the moment that a Pass data writing result was obtained.

After the judgment information on each verify level is written into the latch circuit 20, the control circuit 6 judges whether the number of defective bits Np in data writing meets the allowable number of bits N1 for defects (a step ST4). The allowable number of bits N1 may be the allowable number of bits per page, the allowable number of bits per block, or the allowable number of bits per threshold level (per data).

In this embodiment, when information (ULAT and LLAT) stored by the upper data latch (ULAT) and the lower data latch (LLAT) is "11", a memory cell associated with the latches corresponds to verify Pass (write Pass). Further, at the step ST3, a value in the upper data latch and a value in the lower data latch are subjected to the "and" operation, and a result of this operation is written into the lower data latch 22. That is, when information stored by the lower data latch 22 is "0", a memory cell associated with this latch is a defective bit.

Therefore, the flash memory 1 according to this embodiment can easily detect the number of defective bits Np by counting the number of the lower data latches (LLAT) 21 storing data "0".

When the number of defective bits Np is larger than the allowable number of bits N1 (when Np>N1), data writing is determined to be Fail. In this case, for example, the data writing is again executed with respect to the same block by the operations from the step ST1 to the step ST4. It is to be noted that, if the number of defective bits Np does not become equal to or below the allowable number of bits N1 even though the operations from the step ST1 to the step ST4 are repeated a predetermined number of times, the block into which the data is to be written may be changed to another block to carry out the data writing.

When the number of defective bits Np is equal to or below the allowable number of bits N1 (when Np≦N1), data writing is determined to be Pass, and the data writing with respect to a selected page or a selected block is terminated.

For example, the number of defective bits Np obtained at the step ST4 may be stored by the control circuit 6 until one write sequence is completed.

When the number of defective bits meets the allowable value, verify reading is executed (a step ST5).

For example, at the step ST5, a memory cell that is a check target of the verify reading is a memory cell having the Pass writing result at the step ST2. That is, the verify reading is executed with respect to a memory cell associated with the lower data latch 22 storing "1" (the Pass information) at the step ST3. At the step ST5, the verify reading is not executed with respect to a memory cell associated with the lower data latch 22 storing "0" (the Fail information). Consequently, as compared with an example where the verify reading is executed with respect to all the memory cells, the verify reading is executed at a higher speed and power consumption is reduced.

In this embodiment, the verify reading is executed in an order of the "C" level, the "B" level, and the "A" level. However, the verify reading is not restricted to this order, and it may be executed in an order of, e.g., the "A" level, the "B" level, and the "C" level.

As judgment levels for the verify reading, for example, read levels CR, BR, and AR are utilized to execute "C", "B", and "A" reading. However, to improve an accuracy and reliability of data writing by performing verification in the narrow range like a high-potential end and a low-potential end of each threshold distribution, the verification may be carried out on, e.g., a "CVH"-"CV" level, a "BVH"-"BV" level, and an "AVH"-"AV" level at the step ST5. "CVL", "BVL", and "AVL" levels may be of course used as the judgment levels for the verify reading at the step ST5.

Figure 7:
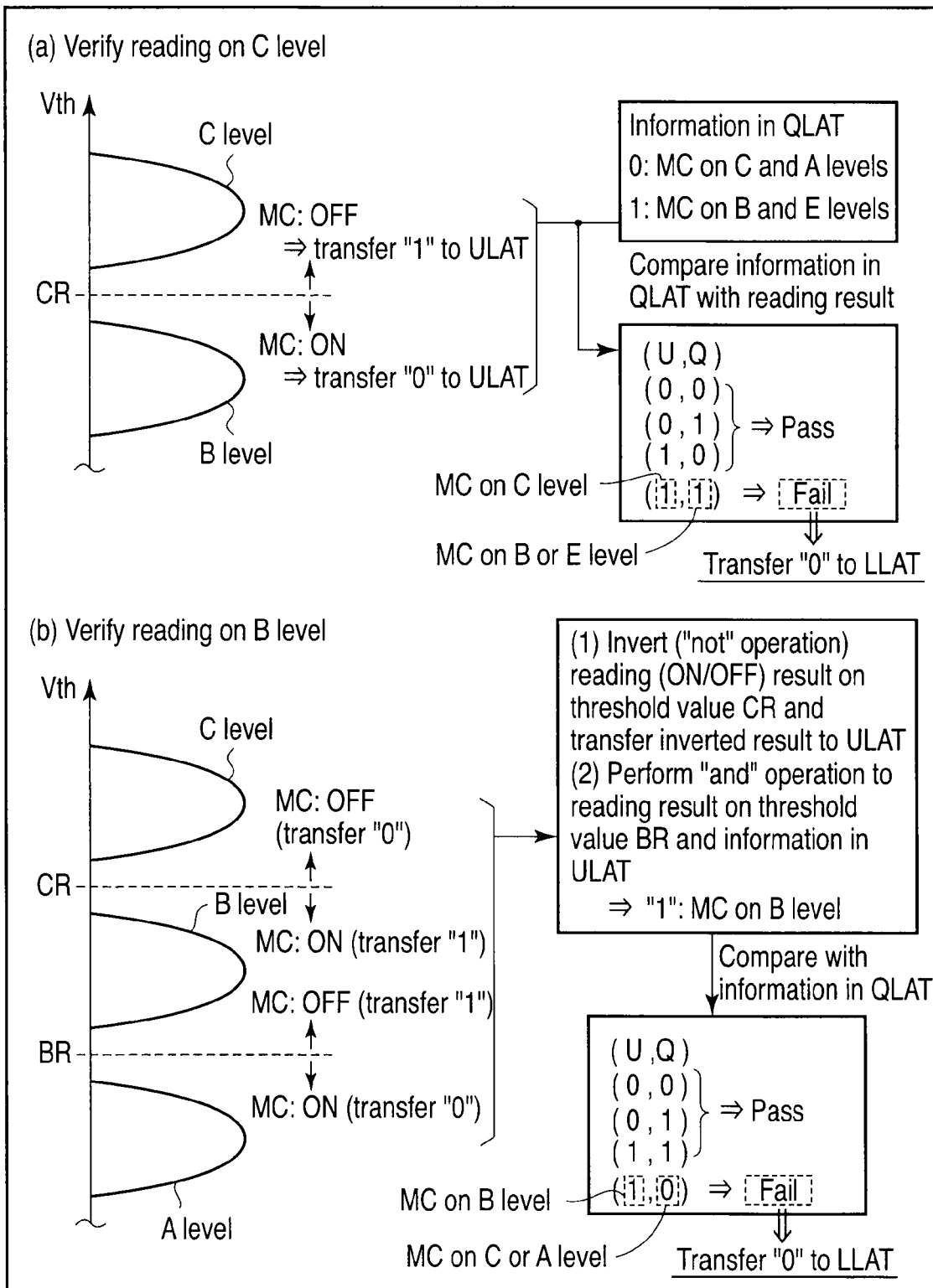
FIG. 7 is a view schematically showing the operation of the flash memory according to the first embodiment.

The verify reading in the flash memory according to this embodiment will now be described with reference to FIG. 7. FIG. 7 schematically shows a verify read operation in the flash memory according to this embodiment.

The (a) of FIG. 7 shows the verify reading on the "C" level.

In the verify reading on the "C" level, a "CR" level is used as the judgment level to execute "C" reading.

When a potential on the "CR" level is applied to a selected word line WL, whether memory cells MC are a "C" level cell or other memory cells are judged based on whether the memory cells connected to this word line are turned on (whether potentials in the bit lines fluctuate).

Since a threshold potential in the memory cell MC on the "C" level is higher than a potential on the "CR" level, the "C" level cell is OFF even though the potential on the "CR" level is applied to the word line.

On the other hand, since threshold potentials in the "B" level cell, the "A" level cell, and the "E" level cell are lower than the potential on the "CR" level, these cells are turned on. In this manner, whether each memory cell is turned on or off can be judged based on a given judgment level (a potential in the word line).

In the verify reading in the flash memory according to this embodiment, when a judgment level (here, the "CR" level) equal to or lower than a lower end of a threshold distribution (here, the "C" level) of a memory cell that is a given verify target is used, information of "1" is assigned to each OFF memory cell, and information of "0" is assigned to each ON memory cell.

Furthermore, "1" is transferred to the latch circuit 20 associated with the OFF memory cell MC, and "1" is written into the upper data latch (ULAT) 21. Each memory cell that is not turned on in the "C" reading is the "C" level cell. On the other hand, "0" is transferred to the latch circuit 20 associated with the ON memory cell MC, and "0" is written into the upper data latch 21. Each memory cell that is turned on in the "C" reading is each of "B", "A", and "E" level cells.

Since the data writing and the allowable value judgment have been performed, it is possible to rewrite the data stored by the upper data latch with a result of the verify reading (a verification result).

Here, at the steps ST1 to ST3, the flag latch 23 associated with each memory cell determined to be the "C" level cell stores the information of "0", and the flag latch 23 associated with each memory cell determined to be the "B" or "E" level cell stores the information of "1". Moreover, the flag latch 23 associated with each memory cell determined to be the "A" level cell stores the information "0" like the "C" level cell.

A result of the verify reading on the "C" level (the information stored by the upper data latch ULAT) is compared with the information stored by the flag latch (QLAT) 23.

When the information in (ULAT and QLAT) is (0, 0), the information ("0") in the upper data latch (ULAT) is indicative of the "B", "A", or "E" level cell, and the information ("0") in the flag latch (QLAT) is indicative of the "C" or "A" level cell. Therefore, since the memory cell associated with the latches (ULAT and QLAT)=(0, 0) may possibly be the "A" level cell, the control circuit 6 determines the data writing (the verify reading) has a Pass result.

When the information in (ULAT and QLAT) is (0, 1), the information ("0") in the upper data latch (ULAT) is indicative of the "B", "A", or "E" level cell, and the information ("1") in the flag latch is indicative of the "B" or "E" level cell. Therefore, since the memory cell associated with the latches (ULAT and QLAT)=(0, 1) may possibly be the "B" or "E" level cell, the control circuit 6 determines the verify operation has a Pass result.

When the information in (ULAT and QLAT) is (1, 0), the information ("1") in the upper data latch (ULAT) is indicative of the "C" level cell, and the information ("0") of the flag latch is indicative of the "A" or "C" level cell. Therefore, the memory cell associated with the latches (ULAT and QLAT) =(1, 0) is the "C" level cell, and hence the control circuit 6 determines a Pass result.

When the information in (ULAT and QLAT) is (1, 1), the information ("1") in the upper data latch (ULAT) is indicative of the "C" level cell, and the information ("1") in the flag latch is indicative of the "B" or "E" level cell. In this case, since a result of the verify reading does not coincide with the written data, the control circuit 6 or the operation unit 12 determines that the memory cell associated with the latches (ULAT and QLAT)=(1, 1) has a Fail result of the data reading.

For example, Fail information indicative of "1" (a verification bit) is transferred to the latch circuit 20 associated with the memory cell determined to have a Fail write result, and this Fail information is written into the lower data latch (LLAT) 22 in the latch circuit 20. It is to be noted that Pass information (a verification bit) in this example is indicative of "0".

The Fail information in the verify reading is obtained when the control circuit 6 or the operation unit 12 operates (compares) data in (ULAT and QLAT), for example.

The data in the flag latch 23 is associated with data stored in a memory cell having a Pass write result in the flow of the steps ST2 and ST3.

In this manner, the latches in the page buffer temporarily store a judgment result of the verify operation and compare a result of the verify reading (a verification result) with data that should be stored in a memory cell having a Pass result of data writing. As a result, the flash memory according to this embodiment detects a defect that a threshold value of each memory cell fluctuates after the writing has been determined to have a Pass result by the verify writing.

After the verify reading on the "C" level, verify reading on the "B" level is executed.

The (b) of FIG. 7 shows the verify reading on the "B" level.

In the operation of the flash memory according to this embodiment, the verify reading on the "B" level is executed based on the "B" reading and the "C" reading.

In the verify reading on the "B" level, the "C" reading is first executed. As a result, "0" is transferred to the upper data latch (ULAT) 21 associated with a "C" level cell (an OFF memory cell), and "1" is transferred to the upper data latch 21 associated with a "B" level cell (an ON memory cell). Here, when an ON state of the memory cell is represented by "0" and an OFF state of the memory cell is represented by "1", a read result in the "C" reading corresponds to a value obtained (inverted) by subjecting each of these values to a "not" operation. As described above, in the verify reading in the flash memory according to this embodiment, when a judgment level (here, the "CR" level) that is equal to or above an upper end of a threshold distribution (here, the "B" level) of a memory cell that is the verify target is used, information ("0") obtained by inverting (performing the "not" operation to) the result ("1") is assigned to the OFF memory cell, and information ("1") obtained by inverting the result ("0") is assigned to the ON memory cell. Additionally, the result of the verify reading is written into the upper data latch associated with these memory cells.

In the verify reading on the "B" level, after the "C" reading, the "B" reading is executed. In the "B" reading, OFF memory cells are the "B" and "C" level cells, and ON memory cells are the "A" and "E" level cells. "1" is assigned to the OFF memory cell (the "B" level cell), and "0" is assigned to the ON memory cell (the "A" level cell). The control circuit 6 or the operation unit 12 performs arithmetic processing (e.g., an "and" operation) to a result of the "B" reading and a result of the "C" reading stored by the upper data latch 21. A memory cell having "1" as this operation result is determined to be the "B" level cell. A memory cell having "0" as the operation result is a cell other than the "B" level cell. Each of these operation results is written into the upper data latch 21.

Operation results of the "C" reading and the "B" reading are compared with information stored by the flag latch (QLAT) 23. As described above, when the information in the flag latch 23 is "1", a memory cell associated with this latch 23 is the "B" or "E" level cell. When this information is "0", a memory cell associated with this latch is the "C" or "A" level cell.

When the "C" reading and the "B" reading have an operation result "0", memory cells associated with this result are on the "C", "A", and "E" levels, and hence Pass is determined irrespective of which one of "0" and "1" is the information in the flag latch 23.

When the "C" reading and the "B" reading have an operation result "1", this result is associated with the "B" level cell alone. When information stored by the flag latch 23 is "1", a judgment result at the time of data writing coincides with a judgment result at the time of verify reading. Contrarily, when information stored by the flag latch 23 is "0", the two judgment results contradict each other. Therefore, when information in (ULAT and QLAT) is (1, 1), data writing (verification) is determined to be Pass. On the other hand, when information in (ULAT and QLAT) is (1, 0), data writing is determined to be Fail. Based on these judgment results, Fail information is transferred to the latch circuit 20, and data "1" is written into the lower data latch (LLAT) 22.

The verify reading on the "A" level and the "E" level is executed in substantially the same manner as the verify reading on the "C" and "B" levels.

The verify reading on the "A" level is executed by using two read levels like the verify reading on the "B" level. That is, in the verify reading on the "A" level, the "B" reading and the "A" reading are carried out. Further, operation results of these read operations are compared with information stored by the flag latch (QLAT) 23 to verify whether each memory cell stores predetermined data (here, "01"). When this result is Fail, i.e., when information in (ULAT and QLAT) is (1, 1), Fail information ("0") is written into the lower data latch associated with this memory cell. In any other case, data writing (verification) corresponds to Pass.

The verify reading on the "E" level is executed based on the "A" reading. Here, on the "AR" level, an ON memory cell is the "E" level cell, and OFF memory cells are "C", "B", and "A" level cells. "1" is written into the upper data latch 21 associated with the ON memory cell, and "0" is written into the upper data latch 21 associated with each memory cell that is not in the ON state. Furthermore, a result of the "A" reading stored by the upper data latch 21 is compared with judgment information stored by the flag latch 23 to verify whether each memory cell stores predetermined data (here, "11"). When this result is Fail, i.e., when information in (ULAT and QLAT) is (1, 0), fail information ("0") is written into the lower data latch associated with this memory cell.

As described above, the verify reading for each threshold level is executed, and the Fail information is written into the data latch in the latch circuit 20 when a result of writing (information held by the QLAT) does not coincide with a result of the verify reading.

Based on the result of the verify reading on each level, whether the number of defective bits Nx is equal to or below the allowable number of bits N2 for defects is judged (a step ST6).

The number of defective bits Nx at the step ST6 is, e.g., a total value of the number of defective bits Np in the writing at the step ST4 and the number of defective bits Nr detected by the verify reading. The allowable number of bits N2 at the step ST6 may be different from or equal to the allowable number of bits N1 at the step ST4.

For example, the number of defective bits Nx can be obtained by counting the number of the lower data latches 21 that store data "0" indicative of Fail information.

When the number of defective bits Nx is larger than the allowable number of bits N2 (when Nx>N2), writing is determined to be Fail (a step ST8). In this case, for example, a block into which data is written is changed, and the same data is written into a predetermined page in another block by the same operations at the steps ST1 to ST4. The block having a Fail result of data writing may be used in another write sequence or may be processed as a bad block.

When the number of defective bits Nx is not greater than the allowable number of bits N2 (when Nx≦N2), the data writing is determined to be Pass (a step ST7). As a result, the write sequence for the selected page or block is terminated.

The write operation and its verify operation in the flash memory (e.g., a multi-level NAND type flash memory) according to this embodiment are completed by the operations at the step ST1 to ST8 depicted in FIG. 4.

It is to be noted that the description has been given as to the example where the allowable numbers of bits N1 and N2 for defects at the step ST4 and the step ST6 are set as total allowable numbers of bits on all the threshold levels. However, the allowable number of bits may be set for each threshold level. In this case, if the number of defective bits on a given threshold level is larger than the allowable number of bits set for this threshold level even though the total number of defective bits Np is not greater than the total allowable number of bits N1, write Fail is determined.

Setting the allowable number of bits for each threshold level in this manner enables executing highly reliable writing with respect to the "A" level cell or the "B" level cell when the allowable number of bits N1A for the "A" level and the allowable number of bits N1B for the "B" level are reduced. Therefore, the allowable number of bits N1C for the "C" level can be increased, and a speed of writing can take priority over the reliability of writing in the writing for the "C" level. When the allowable number of bits is set to differ depending on each threshold level, an accuracy of writing for the "A" and "B" levels can be improved, and a high speed of writing for the "C" level can be realized.

Additionally, in regard to the allowable number of bits N2 at the step ST6, the allowable number of bits may be set in accordance with each group including two or more threshold levels that are not adjacent to each other. For example, the allowable number of bits $N2_{AC}$ for defects is set for a group including the "C" and "A" levels, and the allowable number of bits $N2_{BE}$ for defects is set for a group including the "B" and "E" levels. As a result, a writing accuracy of the multi-level flash memory can be improved.

As described above, in the flash memory according to this embodiment, common judgment information is assigned to the threshold levels that are not adjacent to each other. Furthermore, different pieces of judgment information are set to the threshold levels that are adjacent to each other.

Moreover, in memory cells having the same judgment information assigned thereto (e.g., the "C" and "A" level cells), information stored by the upper/lower data latches 21 and 22 is indicative of Pass/Fail bits (memory cells). Therefore, the number of defective bits for each threshold level can be counted by making reference to values in the data latches and the flag latch at the step ST2 and the step ST3 in FIG. 4.

The flash memory 1 according to this embodiment associates these values stored by the latches in the page buffer with a result of the verify reading to judge whether data has been written (Pass/Fail).

As a result, it is possible to detect a defect that a threshold level of a given memory cell changes to a neighboring threshold level due to intercell interference, a write defect, or read disturbance. Consequently, the reliability of the flash memory can be improved.

Additionally, in the flash memory according to this embodiment, to store the judgment information, the existing latches are utilized to sequentially rewrite information (data/a flag) stored by these latches with a verify judgment result. Therefore, in the flash memory according to this embodiment, a dedicated latch that stores the judgment information assigned to the threshold levels that are not adjacent to each other does not have to be added as a new configuration.

Thus, according to the flash memory and its operations of this embodiment, a memory having high operational reliability can be provided without increasing the circuit scale.

In the flash memory according to this embodiment, information stored by the data latches 21 and 22 and the flag latch 23 provided in the latch circuit 20 in the page buffer is rewritten as the operation changes from writing to verification, thereby judging whether data has been written. As descried above, the flash memory according to this embodiment can judge whether the data has been written (Pass/Fail) without using an external controller. Therefore, the flash memory according to this embodiment can verify whether data from the outside coincides with data written in the memory cells without executing transfer of the data between the memory chip and the external controller.

Accordingly, the flash memory according to this embodiment can suppress deterioration in data transfer.

Further, considering a situation that a write defect cannot be detected by the verify operation, an ECC must be utilized to assure the reliability of the memory. In this case, the circuit scale of an ECC circuit in the flash memory increases.

On the other hand, the flash memory according to this embodiment can detect that a threshold level of a memory cell shifts to a neighboring threshold level. Therefore, defects that cannot be detected by the verify operation can be reduced. Accordingly, in the flash memory according to this embodiment, an increase in circuit scale of the ECC circuit can be suppressed.

As descried above, according to the flash memory of this embodiment, the reliability of the memory can be improved without changing the circuit configuration.

(c) Modification

A modification of the flash memory according to the first embodiment will now be described with reference to FIG. 8.

In the example described with reference to FIG. 4 to FIG. 7, at the time of the "C" writing, the verification on the "CVL" level is performed to execute the verification for the "C" level cell. However, in the flash memory, a flag for the "C" writing may not be input, and the verification on the "CVL" level may not be executed. Even in a situation that the verification is not executed at the time of the "C" writing like this case, highly reliable operation can be executed without increasing the number of the latches or without using an external controller like the flash memory described with reference to FIGS. 4 to 7.

FIG. 8 shows an example of each threshold level and judgment information associated therewith.

For example, at the time of "A" writing with respect to a selected cell, judgment information is transferred to the latch circuit 20 associated with a memory cell having a Pass result of this writing.

Further, as shown in FIG. 8, judgment information of (ULAT, LLAT, QLAT)=(1, 1, 0) is written into the data latches (ULAT and LLAT) and the flag latch (QLAT) in the latch circuit associated with the "A" level cell, respectively.

Furthermore, at the time of the "B" writing with respect to a selected cell, judgment information of (ULAT, LLAT, QLAT)=(1, 0, 1) is written into the data latches and the flag latch associated with the memory cell having a Pass result of this writing, respectively.

Moreover, at the time of the "C" writing with respect to a selected cell, judgment information (ULAT, LLAT, QLAT)= (1, 1, 1) is written into the data latches and the flag latch in the latch circuit 20 associated with the memory cell having a Pass result of this writing.

Any judgment information other than that described above indicates a memory cell having a Fail result of writing.

After the end of the data writing and before the start of execution of the verify reading, information stored by the lower data latch (LLAT) and information stored by the flag latch (QLAT) are converted, respectively.

For example, as shown in FIG. 8, the information stored by the two latches (LLAT and QLAT) associated with a memory cell that should store the "A" level is converted into (0, 1). The information stored by the two latches (LLAT and QLAT) associated with a memory cell that should store the "B" level is converted into (1, 0). Further, the information stored by the two latches (LLAT and QLAT) associated with a memory cell that should store the "C" or "E" level is converted into (1, 1).

Additionally, the information stored by the two latches (LLAT and QLAT) associated with a memory cell having a Fail result of writing is converted into (0, 0). When the judgment information is converted, information stored by the upper data latch (ULAT) may take any one of two states, i.e., "0" and "1".

After converting the judgment information, the operations from the step ST4 to the step ST8 in FIG. 4 are executed. A result of the writing and a result of the verify reading are compared, and information stored by the two latches (LLAT and QLAT) is rewritten into (0, 0) when these results do not coincide with each other. As a result, a total number of detected write defects can be counted.

Even when the judgment information is assigned as shown in FIG. 8, the common judgment information is assigned to threshold levels that are not adjacent to each other like the example shown in FIG. 4 to FIG. 7, thereby detecting a memory cell into which predetermined data has not been written.

Although the example depicted in FIG. 4 to FIG. 7 has been described by using the multi-level flash memory having four levels (2 bits), substantially the same operations as those shown in FIG. 4 to FIG. 7 can be executed with respect to a multi-level flash memory that processes data consisting of 3 bits or more.

For example, in an 8-level memory, "D", "E", "F", and "G" levels are set as threshold levels (threshold distributions) of memory cells in addition to the "C" to "A" levels and the erase level (which will be referred to as an "Er level" in this example) in association with data to be stored ("000" to "111").

In the case of an 8-level flash memory, three data latches (ULAT, MLAT, and LLAT) and one flag latch (QLAT) are provided in the latch circuit 20 of the page buffer 5.

For example, if there is not flag (QPW information) associated with the "Er" (erase) level, the same judgment information is assigned to "Er", "B", "D", and "F" level cells, and the same judgment information is assigned to "A", "C", "E", and "G" level cells, thereby storing these pieces of judgment information in the latch circuit even after writing data.

As a result, defects of data writing can be detected like the above-described example.

Further, like the example shown in FIG. 8, in memory cells storing 8-level data, when a verify operation in the QPW mode is not executed with respect to the highest threshold level, assigning judgment information as follows enables realizing a highly reliable flash memory like the foregoing example.

For instance, the same judgment information is set with respect to "A", "D", and "G" level cells. The judgment information for the "A", "D", and "G" level cells is set to (ULAT, MLAT, LLAT, QLAT)=(0, 1, 1, 0). Furthermore, the same judgment information is set to "B" and "E" level cells. The judgment information for the "B" and "E" level cells is set to (ULAT, MLAT, LLAT, QLAT)=(1, 1, 1, 0). The same judgment information is set to the "Er", "C", and "F" levels. The judgment information for "Er", "C", and "F" level cells is set to (ULAT, MLAT, LLAT, QLAT)=(1, 1, 1, 1).

Moreover, in the 8-level memory cells, like the 4-level memory cells depicted in FIG. 8, two or more threshold levels (threshold distributions) that are not adjacent to each other are determined as one group, three or more groups are set, and conversion processing is executed with respect to data in the plurality of latches in the latch circuit, thereby obtaining Pass/Fail information.

As described above, the judgment information configured to judge data that is to be stored in the memory cells is set with respect to the 8-level flash memory in such a manner that the same judgment information can be provided to each group including the threshold levels that are not adjacent to each other. The threshold levels that are adjacent to each other have different pieces of judgment information.

These pieces of judgment information are rewritten into information indicative of Fail or Pass based on an arithmetic operation of information (data) stored by the latches or conversion after writing.

As a result, defects of data writing can be detected in substantially the same manner as the 4-level flash memory.

Like the 8-level flash memory, when the number of bits in data that is written into one memory cell increases, the range of a threshold distribution associated with the data decreases. Therefore, a possibility that a threshold potential in a memory cell associated with given data shifts to a threshold distribution associated with other neighboring data increases.

Thus, when information configured to judge data to be stored is assigned to threshold distributions that are not adjacent to each other as the number of bits in data stored in one memory cell increases like the first embodiment, detecting a write defect and read disturbance can be validated.

Here, the 8-level memory cell is exemplified as a memory cell that stores data having 4 levels (2 bits) or more, but this embodiment can be, of course, applied to, e.g., a 16-level or 32-level memory cell.

As described above, in the flash memory according to the modification of the first embodiment, the reliability of the flash memory can be improved without changing the circuit configuration.

(2) Second Embodiment

A flash memory according to a second embodiment will now be described with reference to FIG. 9. It is to be noted that a circuit configuration of a flash memory according to this embodiment is equal to the configuration of the flash memory according to the first embodiment (see FIG. 1 to FIG. 3), thereby omitting an explanation thereof.

As shown in FIG. 3, an intensity of a read non-selected potential $V_{READ}$ used for data reading is set to an intensity of the highest threshold level or above (a "C" level in FIG. 3) with respect to a plurality of threshold levels (threshold distributions) associated with data. Here, the read non-selected potential $V_{READ}$ means a potential applied to a non-selected word line (a non-selected potential). For example, a potential of approximately 0 V (a selected potential) is applied to a selected word line.

In the flash memory, besides a defect of first embodiment, there is, e.g., a defect that a threshold value of a memory cell in which "C" level writing should be performed becomes equal to or above the read non-selected potential $V_{READ}$ that is used at the time of data reading (a read sequence) based on a read command.

At the time of data writing, when a threshold value of a memory cell changes to the read non-selected potential $V_{READ}$ or above, all memory cells in the same cell unit as this cell may be determined to be on the "C" level as the threshold level due to mutual interference between cells.

In a memory cell having a threshold potential that is equal to or above the read non-selected potential $V_{READ}$, since a threshold level of the memory cell is determined to be present on the "C" level or above higher than the "AV" level regardless of the memory cell in which, e.g., "A" level writing should be carried out, this situation is processed similarly to the case in which data has been normally written even though a defect (Fail) is actually provided.

Furthermore, at the time of data reading, when a threshold potential in a given memory cell reaches the read non-selected potential $V_{READ}$ or above, there is a memory cell that is not turned on even though the read non-selected potential $V_{READ}$ is supplied to a word line. Therefore, in a memory cell unit including a memory cell on a threshold level that is equal to or above the read non-selected potential $V_{READ}$, even if the memory cell in the memory cell unit stores data other than the "C" level, all the memory cells in this cell unit may be determined as "C" level cells.

To suppress such defects, the flash memory according to the second embodiment executes verify reading in which the read non-selected potential $V_{READ}$ (a judgment level) is applied to word lines. When the read non-selected potential $V_{READ}$ is applied, a threshold potential in a memory cell that is not turned on is higher than the read non-selected potential $V_{READ}$. As a result, the memory cell having the threshold potential higher than the read non-selected potential $V_{READ}$ can be detected without determining a level on which data has been written, whereby this cell can be determined to be defective.

For example, when a total value of the number of memory cells (the number of bits) having write defects and the number of memory cells each having a threshold potential higher than the read non-selected potential $V_{READ}$ is not greater than a predetermined allowable number of bits, writing can be determined as Pass.

An operation of the flash memory according to the second embodiment will now be described hereinafter with reference to FIG. 9.

First, like the step ST1 in FIG. 4 in the flash memory according to the first embodiment, data from the outside is transferred to data latches 21 and 22, and data writing using, e.g., a QPW mode begins (a step ST11).

Moreover, at the time of data writing, when the data writing is determined to correspond to Pass by verification using a judgment level such as "AVL", "AV", or "AVH", Pass information is transferred to the latch circuit 20. An upper data latch (ULAT) 21 and a lower data latch (LLAT) 22 storing data from the outside are overwritten with the Pass information as data "11" in accordance with each single bit ("1") (A STEP ST12).

After the end of the data writing, in the upper/lower data latches 21 and 22 storing information other than the Pass information ("11"), "0" is written into each lower data latch 22 (a step ST13). The number of the lower data latches 22 storing "0" corresponds to the number of defective bits Np.

Thereafter, like the step ST4 in FIG. 4, whether the number of defective bits Np is not greater than the allowable number of bits N1 for defects. When Np>N1 is achieved, data writing is again executed, and the operations from the step ST11 to the step ST14 are repeated.

When Np≦N1 is achieved, data writing is terminated with a write Pass result, and verify reading is executed (a step ST15).

Here, the verify reading in the flash memory according to this embodiment is executed when the read non-selected potential $V_{READ}$ used for data reading based on a read command is applied to word lines WL. For example, the read non-selected potential $V_{READ}$ is sequentially applied to all word lines WL in a selected block to judge ON/OFF of memory cells. Additionally, Fail information indicative of "0" is written into the lower data latch (LLAT) associated with each memory cell that has not been turned on. In memory cells each having a Pass result in the writing, information stored by three latches (ULAT, LLAT, and QLAT) associated with each memory cell having no Pass result in the verify reading is (1, 0, 0).

As a result, each memory cell having a threshold potential equal to or above the read non-selected potential $V_{READ}$ can be detected as a Fail cell.

Although the verify reading is executed by using the read non-selected potential $V_{READ}$ in this example, a high-potential end of the highest threshold level (a threshold distribution) can be used as a judgment level for the verify reading like the "CVH" level of the "C" level in the 4-level memory cell, for example. It is to be noted that a potential level smaller than the "CVH" level like the "BVH" level or the "AVH" level may be used as a judgment level in accordance with a data writing situation. Further, a potential between the read non-selected potential $V_{READ}$ and the high-potential end (the "CVH" level in this example) of the threshold level (the threshold distribution) may be used as a judgment level for the verify reading. As a result, highly accurate data writing can be executed in the multi-level flash memory.

In one write sequence, the "CVH" level may be applied to a word line (a page) that has been through the data writing and the read non-selected potential $V_{READ}$ may be applied to any other word line, thereby executing the verify reading. Furthermore, the "CVH" level may be applied to a word line that has been through the data writing and a word line adjacent thereto and the read non-selected potential $V_{READ}$ may be applied to any other word line, thereby executing the verify reading.

As shown in these examples, more accurate data writing can be realized by changing a supply potential (a judgment potential) for each word line used for the verify reading depending on whether a word line has been through the data writing.

Then, whether the number of defective bits Nx meets the allowable number of bits N1 for defects is judged (a step ST16). The number of defective bits Nx in this example corresponds to the number of the lower bit latches storing "0". The number of defective bits Nx includes the number of memory cells corresponding to write Fail and the number of memory cells determined to have a threshold value which is not lower than the read non-selected potential $V_{READ}$ as a result of the verify reading.

When Nx>N1 is achieved, like the step ST8 in FIG. 4, write Fail is determined. Further, after processing, e.g., changing a block, the data writing is continuously executed.

When Nx≦N1 is achieved, like the step ST7 in FIG. 4, write Pass is determined (a step ST17), and the write sequence for the selected page or the selected block is completed.

At the above-described step ST15, in one write sequence, the verify reading using the read non-selected potential $V_{READ}$ is executed with respect to all the word lines.

However, before the verify reading is executed, the verify reading using the read non-selected potential $V_{READ}$ may be performed with respect to a word line (a page) which has been through data writing alone.

In this case, since a memory cell of the word line having no data written therein is the "E" level cell in, e.g., a 2-level flash memory. Substantially the same result as that of the step ST15 can be obtained even when the verify reading is executed by using the "AR" level lower than the read non-selected potential $V_{READ}$ without utilizing the read non-selected potential $V_{READ}$.

As a result, a threshold level of a memory cell into which data is to be written can be judged by using a potential lower than the read non-selected potential $V_{READ}$ as a judgment potential. Further, since a judgment level lower than the read non-selected potential $V_{READ}$ is used, the power consumption for the verify reading can be reduced as compared with the read non-selected potential $V_{READ}$ is applied to all the word lines WL to execute the verify reading.

It is to be noted that the explanation has been given as to a 4-level flash memory which is an example of the flash memory according to this embodiment, but the verify reading in the write sequence of the 2-level flash memory may be executed by using the read non-selected potential $V_{READ}$.

As described above, according to the flash memory of the second embodiment, the reliability of the operations can be improved without changing the circuit configuration.

(3) Application

An application of the first and second flash memories will now be described.

The operation of the flash memory according to the first embodiment (see FIG. 4) may be combined with the operation of the flash memory according to the second embodiment (see FIG. 9) to constitute one flash memory.

The flash memory according to the first embodiment uses judgment information assigned to each group including two or more threshold levels (threshold distributions) that are not adjacent to each other to judge whether data has been written. As a result, it is possible to detect that a threshold level of a memory cell having given data written therein has shifted to a threshold distribution adjacent to a threshold distribution associated with this data, thereby detecting a write defect.

The flash memory according to the second embodiment can detect a write defect that a threshold level of a memory cell becomes equal to or above a read non-selected potential $V_{READ}$.

For example, the operation shown in FIG. 4 and the operation depicted in FIG. 9 are executed during one write sequence of the flash memory. It is to be noted that adopting an order that the operation in FIG. 4 is executed and then the operation in FIG. 9 is performed or its reverse order is not important. Moreover, the operations depicted in FIG. 4 and FIG. 9 may be partially combined. For example, the operation from the step ST1 to the step ST8 in FIG. 4 may be executed as a first verify read operation (first verify operation), and then the operation from the step ST15 to the steps ST17 and ST18 in FIG. 9 may be executed as a second verify read operation (a second verify operation).

Additionally, the operations depicted in FIG. 4 to FIG. 9 can be, of course, applied to a 2-level flash memory, a multi-level flash memory adopting a write mode other than the QPW mode (e.g., an LM mode or a Foggy and Fine mode), or a flash memory which is of the AND type or NOR type excluding the NAND type.

Further, although the flash memory has been exemplified in this embodiment, the operations shown in FIG. 4 to FIG. 9 can be applied to other memories that can store data having two or more levels (e.g., a Resistive RAM or a Phase Change RAM).

As described above, the memory reliability of the memory described in the application can be improved without changing the circuit configuration like the flash memories according to the first and second embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
a plurality of memory cells arranged in a memory cell array in the form of a matrix, the memory cells storing data having two or more levels associated with two or more threshold levels, respectively; and
a control circuit configured to control operations of the memory cells, the control circuit executing data reading by using a selected potential applied to a selected word line and a non-selected potential applied to a non-selected word line in a read sequence, the non-selected potential being larger than the selected potential, and the control circuit executing data writing with respect to the memory cells and verification using a judgment level that is not lower than the non-selected potential in a write sequence.

* * * * *